(12) United States Patent
Huh et al.

(10) Patent No.: US 8,053,343 B2
(45) Date of Patent: Nov. 8, 2011

(54) METHOD FOR FORMING SELECTIVE EMITTER OF SOLAR CELL AND DIFFUSION APPARATUS FOR FORMING THE SAME

(75) Inventors: Yusung Huh, Anyang-si (KR); Seungil Park, Cheonan-si (KR); Mangeun Lee, Daejeon (KR)

(73) Assignee: SNT. Co., Ltd., Gyeonggi-Do (KR)

( * ) Notice: Subject to any disclaimer, the term of this patent is extended or adjusted under 35 U.S.C. 154(b) by 339 days.

(21) Appl. No.: 12/505,305

(22) Filed: Jul. 17, 2009

(65) Prior Publication Data

US 2010/0197061 A1    Aug. 5, 2010

(30) Foreign Application Priority Data

Feb. 5, 2009 (KR) .................. 10-2009-0009156
Feb. 25, 2009 (KR) .................. 10-2009-0015568
May 15, 2009 (KR) .................. 10-2009-0042461

(51) Int. Cl.
*H01L 21/22* (2006.01)
*H01L 21/38* (2006.01)

(52) U.S. Cl. ........ 438/542; 438/546; 438/547; 438/548; 438/549; 257/E21.347; 257/E21.475; 257/E27.123; 257/E27.124; 257/E27.126

(58) Field of Classification Search .................. 438/542, 438/546, 547, 548, 549; 257/E21.347, E21.475, 257/E27.123, E27.124, E27.126
See application file for complete search history.

(56) References Cited

U.S. PATENT DOCUMENTS 6,825,104 B2 * 11/2004 Horzel et al. .................. 438/547

* cited by examiner

*Primary Examiner* — Matthew Landau
*Assistant Examiner* — Sonya McCall Shepard
(74) *Attorney, Agent, or Firm* — IPLA P.A.; James E. Bame

(57) ABSTRACT

A method for forming a selective emitter of a solar cell and a diffusion apparatus for forming the same are provided. The method includes texturing a surface of a silicon substrate by etching the silicon substrate, coating an impurity solution on the surface of the silicon substrate, injecting a first thermal energy into the whole surface of the silicon substrate, and, while the first thermal energy is injected into the whole surface of the silicon substrate, injecting a second thermal energy by irradiating a laser beam into a partial region of the surface of the silicon substrate.

25 Claims, 28 Drawing Sheets

METHOD FOR FORMING SELECTIVE EMITTER OF SOLAR CELL AND DIFFUSION APPARATUS FOR FORMING THE SAME

CROSS REFERENCE

This application claims foreign priority under Paris Convention and 35 U.S.C. §119 to each of Korean Patent Application No. 10-2009-0009156 filed 5 Feb. 2009, 10-2009-0015568 filed 25 Feb. 2009, and 10-2009-0042461 filed 15 May 2009 with the Korean Intellectual Property Office.

BACKGROUND OF THE INVENTION

1. Field of the Invention

The present invention relates to a manufacturing method of a solar cell. More particularly, the present invention relates to a method for forming a selective emitter of a solar cell and a diffusion apparatus for forming the same.

2. Description of the Related Art

In recent years, as an environmental pollution problem gets serious, an active research on new and renewable energy for decreasing environmental pollution is conducted. Attention is paid to a solar cell for producing electric energy, particularly, using solar energy among the new and renewable energy. However, in order for the solar cell to be actually applied to industry, a photoelectric conversion efficiency of the solar cell should be high and its manufacturing price should be low.

A description is made in view of the photoelectric conversion efficiency. Because a theoretical limit efficiency of a silicon solar cell is not so high, there is actually a limitation in increasing the photoelectric conversion efficiency of the solar cell. At present, it is reported by a global study group that the silicon solar cell has a photoelectric conversion efficiency of 24% or more.

However, in the case of mass producing the solar cell, it is actually difficult that an average photoelectric conversion efficiency of the solar cell exceeds 17%. Thus, there is a demand for a high efficiency production method applicable to an automation mass production line of a scale of 30 MW or more per year.

In a manufacturing process of a solar cell, an electrode of the solar cell is formed generally by screen printing a metal paste on a substrate. Because of a high contact resistance between a surface of the substrate and the electrode, a photoelectric conversion efficiency of the solar cell may decrease. Thus, in order to reduce the contact resistance, there is a need to form a highly doped region highly doped with impurities in the substrate.

However, if the highly doped region is formed in the whole substrate surface, a cohesion phenomenon occurs because of the existence of excessive impurities. Resultantly, the photoelectric conversion efficiency of the solar cell decreases. Because of this, it is desirable that the highly doped region is selectively formed only in a specific portion of the substrate.

There are a few of conventional methods for forming a selective emitter. The first method includes forming an oxide film pattern on a surface of a substrate by a photolithography process, diffusing impurities in the substrate at a high temperature, and removing the oxide film and diffusing the impurities in the substrate. By twice impurity diffusion, a lowly doped region is formed in a substrate portion covered with the oxide film pattern, and a highly doped region is formed in a substrate portion corresponding to an opening region of the oxide film pattern.

The second method includes forming a silicon oxide film pattern having a partial transmittance on a surface of a substrate, and diffusing impurities in a substrate at a high temperature. In this case, the impurities can partially transmit the silicon oxide film. Thus, a highly doped region is formed in a substrate portion corresponding to an opening region of the silicon oxide film pattern, and a lowly doped region is formed in a substrate portion covered with the silicon oxide film pattern.

However, the above conventional methods have the following problems. In the first method, a manufacturing process of a solar cell is complex and a manufacturing cost of the solar cell increases because a photolithography process, an etching process, a deposition process, etc. are added to form an oxide film pattern on a substrate surface. In addition to this, a photoelectric conversion efficiency of the solar cell manufactured using the first method is not uniform.

In the second method, it is not easy to accurately adjust a transmittance of a silicon oxide film to a desired target value and thus, it is difficult to form a uniform emitter layer in a substrate. A solar cell with the emitter layer having a non-uniform concentration of impurities decreases in its photoelectric conversion efficiency. Also, in the second method, because there is a need for a process of removing an oxide film, etc. after forming a selective emitter, a process time increases. In addition, because the substrate is exposed to an environment of the oxide film removal process, an error rate of the solar cell increases.

SUMMARY OF THE INVENTION

An aspect of exemplary embodiments of the present invention is to address at least the problems and/or disadvantages and to provide at least the advantages described below. Accordingly, an aspect of exemplary embodiments of the present invention is to provide a method for forming a selective emitter of a solar cell, for increasing a photoelectric conversion efficiency of the solar cell even at the time of mass production, by injecting a first thermal energy into the whole substrate using a radiative non-contact heater while injecting a second thermal energy into a partial region or a plurality of regions for forming the selective emitter in the substrate using a laser at the time of a heat treatment process for impurity diffusion.

Another aspect of exemplary embodiments of the present invention is to provide a diffusion apparatus for forming a selective emitter of a solar cell, for increasing a photoelectric conversion efficiency of the solar cell even at the time of mass production, by injecting a first thermal energy into the whole substrate using a radiative non-contact heater while injecting a second thermal energy into a partial region or a plurality of regions for forming the selective emitter in the substrate using a laser at the time of a heat treatment process for impurity diffusion.

To achieve these and other advantages and in accordance with the purpose of the present invention, a method for forming a selective emitter of a solar cell is provided. The method includes texturing a surface of a silicon substrate by etching the silicon substrate, coating an impurity solution on the surface of the silicon substrate, injecting a first thermal energy into the whole surface of the silicon substrate coated with the impurity solution, and, while the first thermal energy is injected into the whole surface of the silicon substrate, injecting a second thermal energy by irradiating a laser beam into a partial region of the surface of the silicon substrate coated with the impurity solution.

Impurity ions are diffused into the silicon substrate by the first thermal energy and thus an emitter layer is resultantly formed, and the impurity ions are more diffused into a partial region of the emitter layer by the second thermal energy and thus a selective emitter region is resultantly formed.

The second thermal energy includes a third thermal energy due to the laser beam and the first thermal energy. A temperature by the second thermal energy is equal to a temperature by the first thermal energy and the third thermal energy.

According to one aspect of the present invention, method for forming a selective emitter of a solar cell is provided. The method includes texturing a surface of a silicon substrate by etching the silicon substrate, coating an impurity solution on the surface of the silicon substrate, injecting a first thermal energy into the whole surface of the silicon substrate coated with the impurity solution, and, while the first thermal energy is injected into the whole surface of the silicon substrate, injecting a second thermal energy by irradiating a laser beam into a plurality of set regions of the surface of the silicon substrate coated with the impurity solution.

Impurity ions are diffused into the silicon substrate by the first thermal energy and thus an emitter layer is resultantly formed, and the impurity ions are more diffused into the plurality of set regions of the emitter layer by the second thermal energy and thus a plurality of selective emitter regions are resultantly formed.

The second thermal energy includes a third thermal energy due to the laser beam and the first thermal energy. A temperature by the second thermal energy is equal to a temperature by the first thermal energy and the third thermal energy.

According to another aspect of the present invention, there is provided a diffusion apparatus for forming a selective emitter of a solar cell. The apparatus includes a diffusion chamber, a conveyer, a heater, and a laser generator. The diffusion chamber has an inlet formed at one side and has an outlet formed at the other side. The conveyer conveys a silicon substrate whose surface is textured by an etching process and which is coated with an impurity solution, into the diffusion chamber. The heater generates a first thermal energy and injects the first thermal energy into the whole surface of the silicon substrate conveyed into the diffusion chamber. The laser generator irradiates a laser beam into a partial region or a plurality of set regions of the surface of the silicon substrate.

Impurity ions are diffused into the silicon substrate by the first thermal energy and thus an emitter layer is resultantly formed, and the impurity ions are more diffused into a partial region of the emitter layer by the second thermal energy and thus a selective emitter region is resultantly formed.

The second thermal energy includes a third thermal energy due to the laser beam and the first thermal energy. A temperature by the second thermal energy is equal to a temperature by the first thermal energy and the third thermal energy.

BRIEF DESCRIPTION OF THE DRAWINGS

The above and other objects, features and advantages of the present invention will become more apparent from the following detailed description when taken in conjunction with the accompanying drawings in which.

Throughout the drawings, the same drawing reference numerals will be understood to refer to the same elements, features and structures.

DETAILED DESCRIPTION OF THE INVENTION

Exemplary embodiments of the present invention will now be described in detail with reference to the annexed drawings. In the following description, a detailed description of known functions and configurations incorporated herein has been omitted for conciseness.

Figure 1:
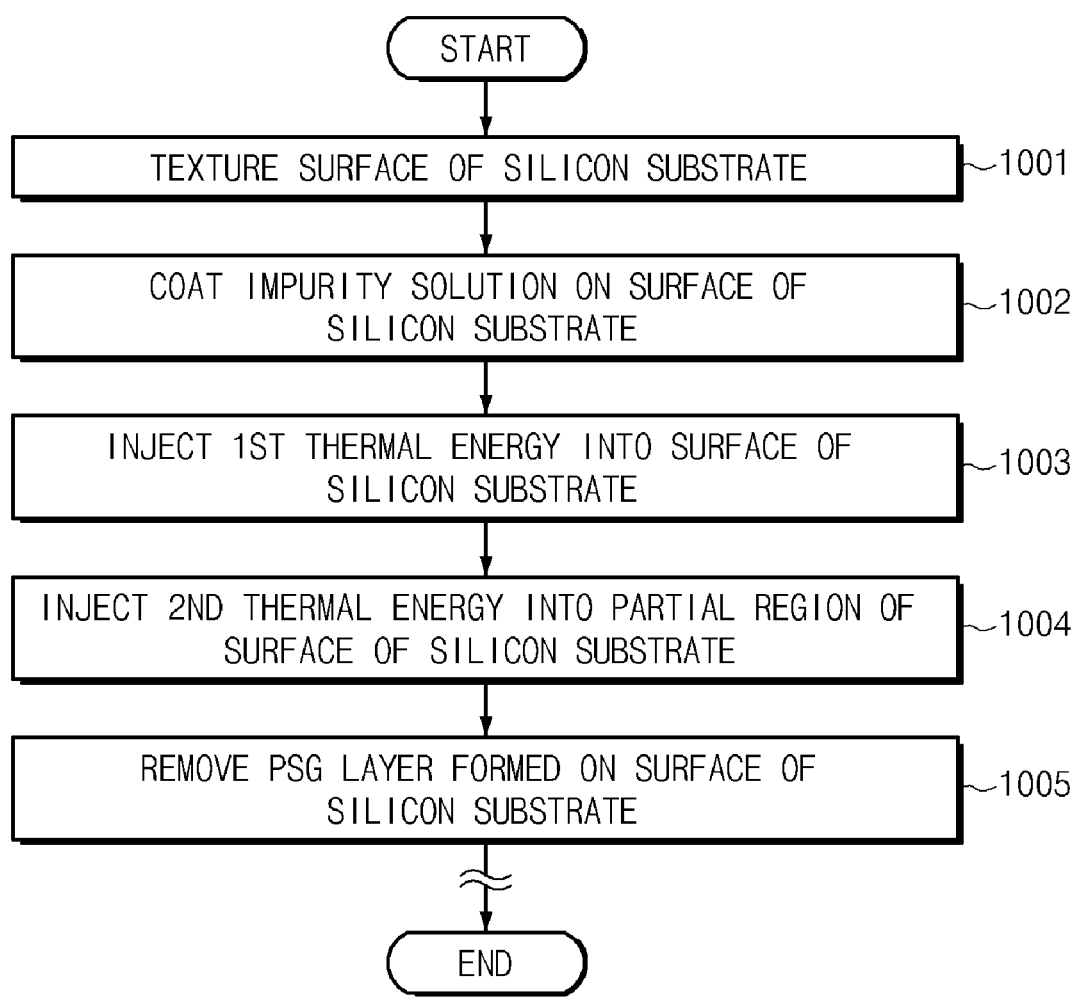
FIG. 1 is a flow diagram illustrating a process of forming a selective emitter of a solar cell according to a first exemplary embodiment of the present invention.

FIG. 1 is a flow diagram illustrating a process of forming a selective emitter of a solar cell according to a first exemplary embodiment of the present invention.

Referring to FIG. 1, a silicon substrate 111 is etched and a surface of the silicon substrate 111 is textured (step 1001). In step 1001, an unevenness is formed on the surface of the silicon substrate 111 by dry or wet etching. Although not illustrated in detail in FIG. 2, a very minute unevenness is formed on the surface of the silicon substrate 111. The silicon substrate 111 can be a P-type substrate doped with boron (B) ions.

Figure 2:
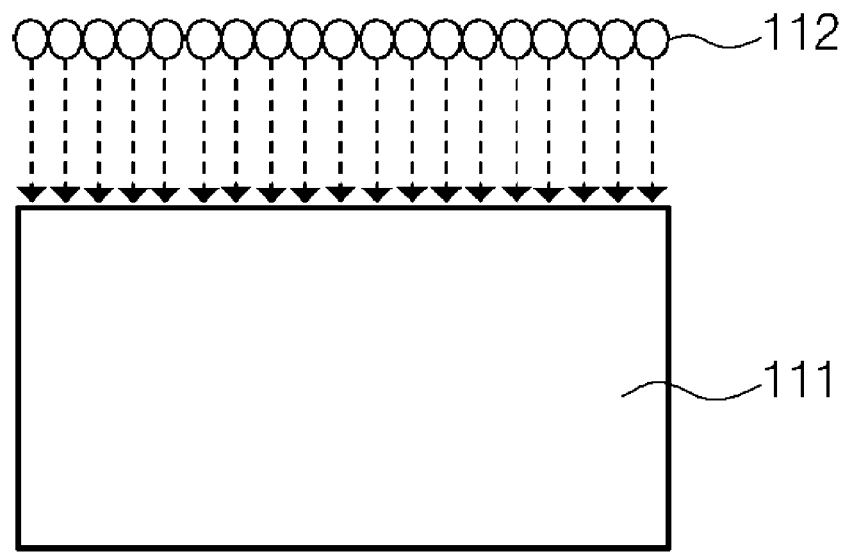
FIG. 2 is a section illustrating a substrate in execution of step 1002 among the process of forming the selective emitter of the solar cell of FIG. 1.
Figure 3:
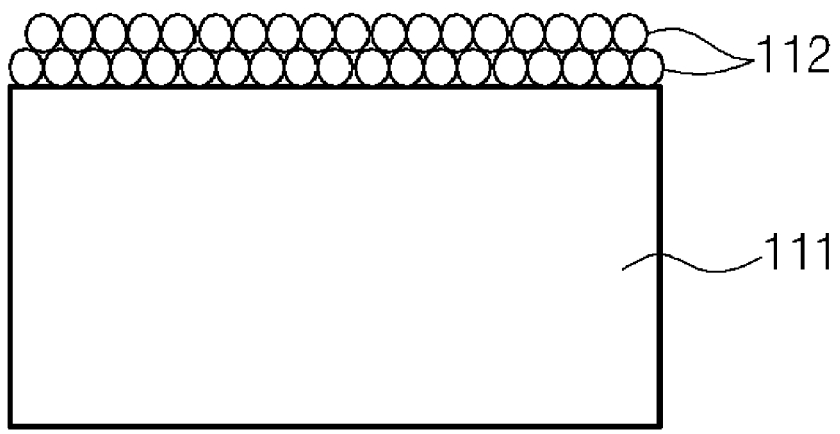
FIG. 3 is a section illustrating a substrate after execution of step 1002 among the process of forming the selective emitter of the solar cell of FIG. 1.

Then, as illustrated in FIG. 2, an impurity solution 112 is sprayed on the textured surface of the silicon substrate 111 and thus, as illustrated in FIG. 3, the impurity solution 112 is coated on the surface of the silicon substrate 111 (step 1002). The impurity solution 112 can be a solution including a phosphorus (P) component. The impurity solution 112 can be also a solution including phosphorus oxychloride ($POCl_3$).

Figure 4:
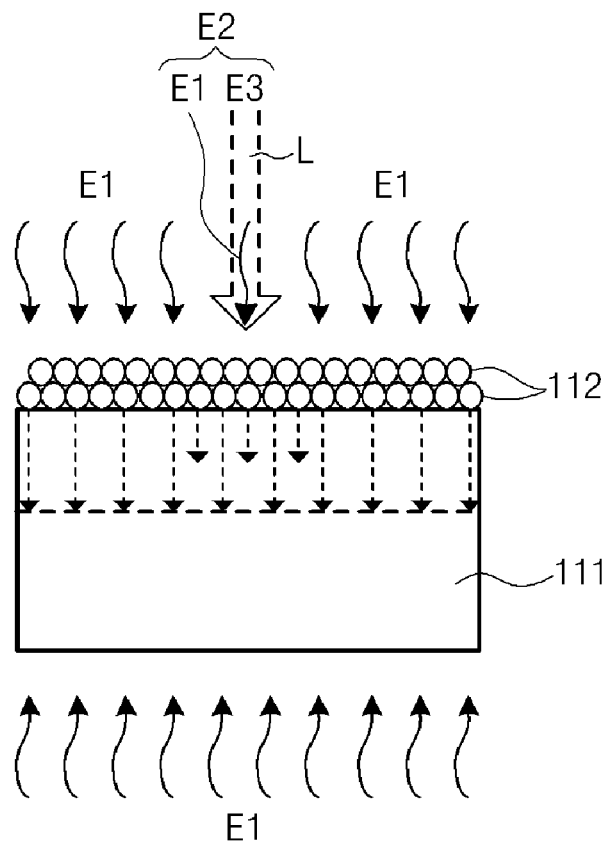
FIG. 4 is a section illustrating a substrate in execution of steps 1003 and 1004 among the process of forming the selective emitter of the solar cell of FIG. 1.
Figure 5:
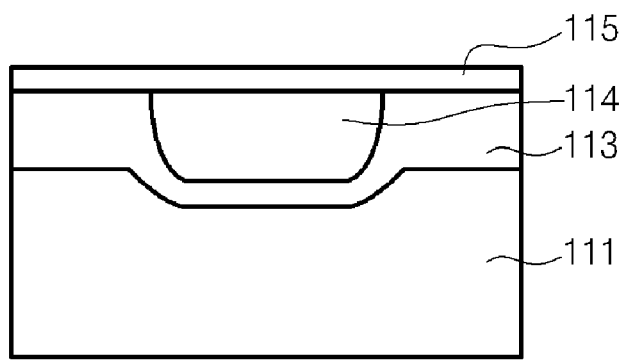
FIG. 5 is a section illustrating a substrate after execution of steps 1003 and 1004 among the process of forming the selective emitter of the solar cell of FIG. 1.
Figure 9:
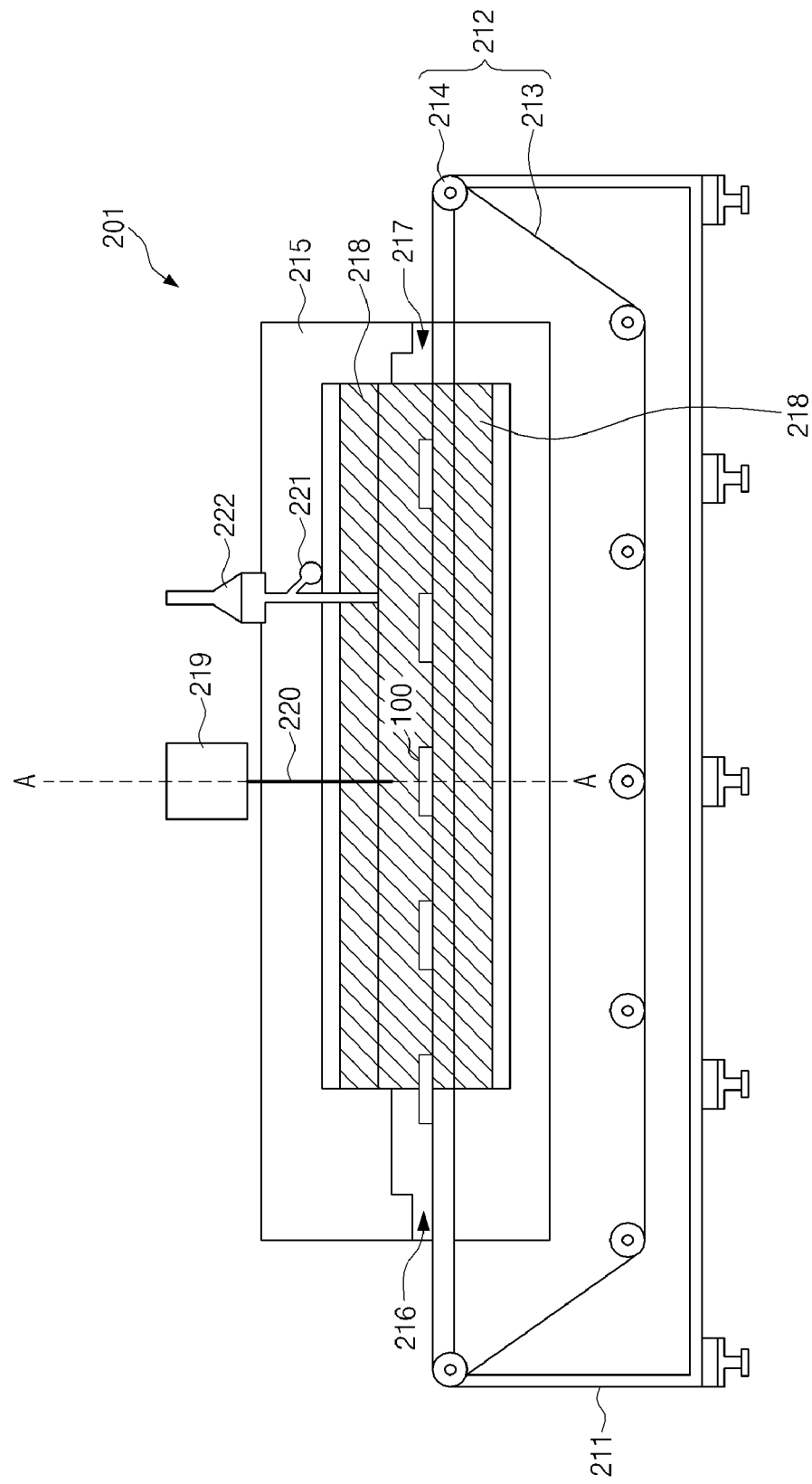
FIG. 9 is a longitudinal section illustrating a diffusion apparatus according to an exemplary embodiment of the present invention.
Figure 37:
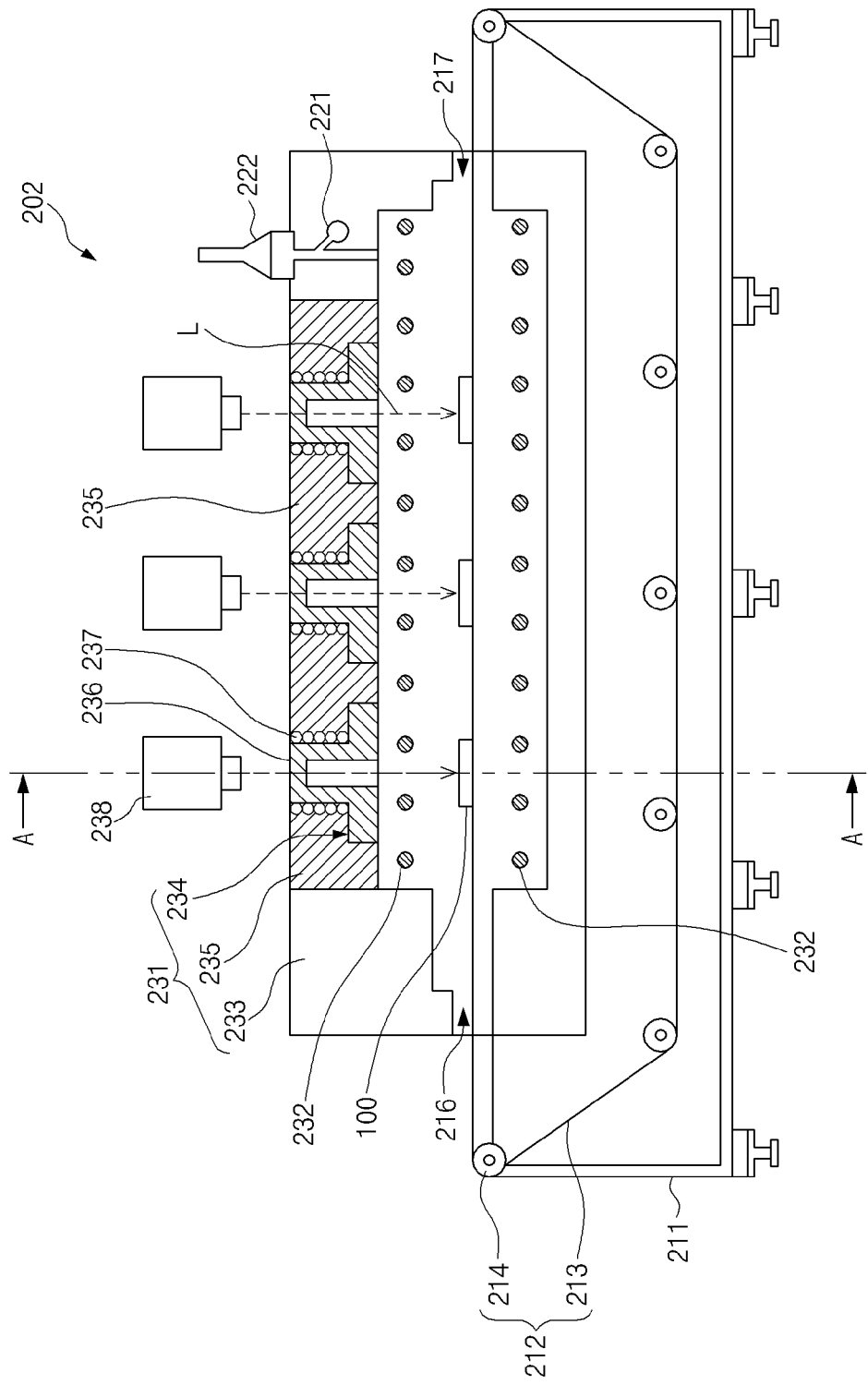
FIG. 37 is a longitudinal section illustrating a diffusion apparatus according to another exemplary embodiment of the present invention.

Next, as illustrated in FIG. 4, a first thermal energy (E1) is injected into the whole surface of the silicon substrate 111 coated with the impurity solution 112 (step 1003). Step 1003 can be implemented by a radiative non-contact heater 218 or 232 of a diffusion apparatus 201 or 202 (FIG. 9 or 37). A temperature (T1) by the first thermal energy (E1) can be set to be in the range of $830° C. \leq T1 \leq 900° C$. As a result of execution of step 1003, impurity ions are diffused into the silicon substrate 111 by the first thermal energy and thus, as illustrated in FIG. 5, an emitter layer 113 is formed. The emitter layer 113 is an N-type doped layer doped with phosphorus (P) ions.

While step 1003 is implemented, that is, while the first thermal energy (E1) is injected into the whole surface of the silicon substrate 111, a laser beam (L) is irradiated into a partial region of the surface of the silicon substrate 111 coated with the impurity solution 112 whereby a second thermal energy (E2) is injected (step 1004). Step 1004 can be implemented by the radiative non-contact heater 218 or 232 of the diffusion apparatus 201 or 202 (FIG. 9 or 37) and a laser generator 219 or 238. A temperature (T2) by the second thermal energy (E2) can be set to be in the range of $830° C. \leq T2 \leq 1,070° C$. The second thermal energy (E2) includes the first thermal energy (E1) by the heater 218 or 232 and a third thermal energy (E3) by the laser beam (L). The temperature (T2) by the second thermal energy (E2) is equal to a temperature by the first thermal energy (E1) and third thermal energy (E3).

As a result of execution of step 1004, the impurity ions are more diffused into the partial region of the emitter layer 113 by the second thermal energy (E2) and thus, as illustrated in FIG. 5, a highly doped region 114 is formed. Below, the highly doped region is called a "selective emitter region". The selective emitter region 114 is an N+-type doped region more doped with phosphorus (P) ions than the emitter layer 113. Part of the selective emitter region corresponds to a region in which a metal electrode 117 (FIG. 8) is deposited.

When the second thermal energy (E2) having a higher temperature than the first thermal energy (E1) is injected into the silicon substrate 111, the impurity ions are better diffused. This principle is a little more described below.

If a concentration of specific atoms is not uniform within a specific solid, the atoms are diffused from a high concentration region to a low concentration region until the concentration of atoms is uniform throughout the solid by thermal movement. The basis of a diffusion phenomenon according to Fick's first law in which an amount of diffusion is proportional to a concentration gradient is given below:

$$J = -D\frac{\partial C}{\partial x} \quad (1)$$

In Equation 1, the 'J' represents an amount of diffusion (i.e., an amount of diffusion materials passing through a unit area), and the 'D' is a diffusion coefficient. Also, the 'C' represents a concentration of diffusion materials, and the 'x' represents a movement distance of a diffusion material in a Y axis.

With an increase of a temperature, the diffusion coefficient (D) rapidly increases. If this is expressed using a function, it is given below:

$$D = D_0 \times e^{-Q/kT} \quad (2)$$

Figure 13:
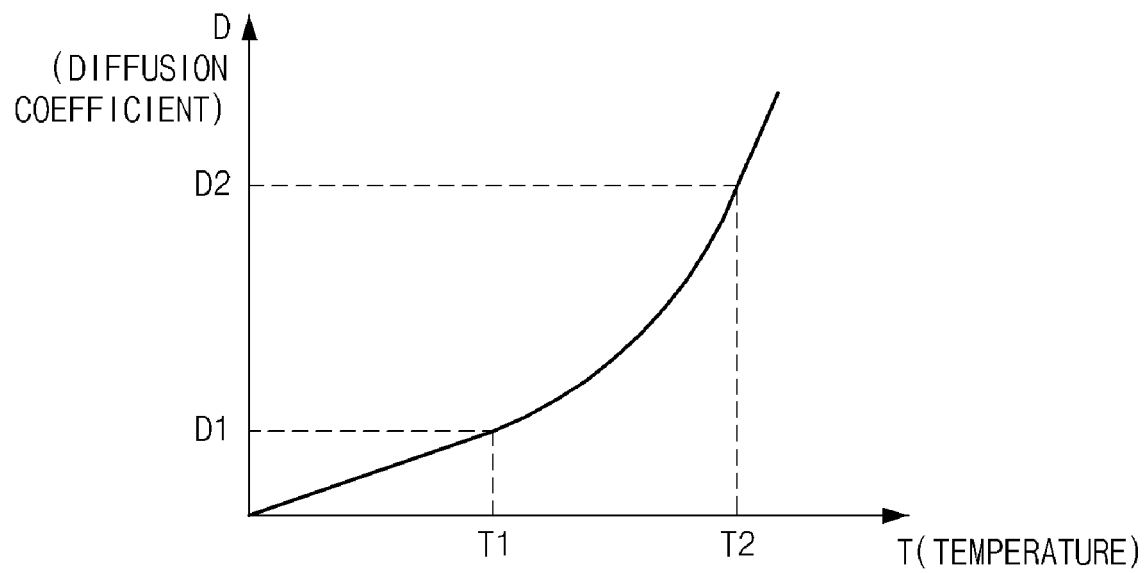
FIG. 13 is a graph illustrating a variation of a diffusion coefficient dependent on a temperature in connection with a process of forming a selective emitter of a solar cell according to the present invention.
Figure 14:
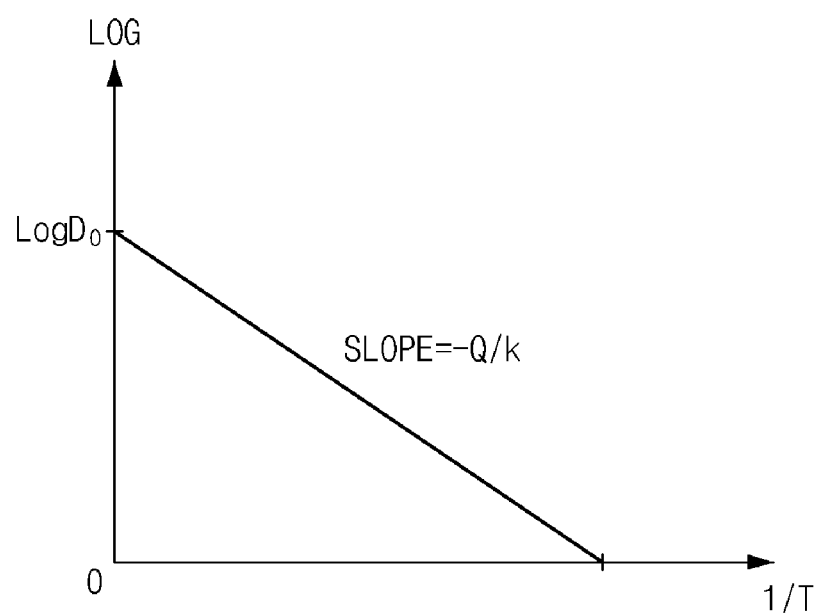
FIG. 14 is a graph illustrating a relationship between a log function of a diffusion coefficient and an inverse of a temperature in connection with a process of forming a selective emitter of a solar cell according to the present invention.

In Equation 2, the '$D_0$' is a constant not sensitive to a temperature, the 'k' is Boltzmann constant, and the 'T' is a temperature. The 'Q' is called activation energy, and has a value of about 2 eV to 5 eV depending on material. FIGS. 13 and 14 illustrate graphs representing a variation of a diffusion coefficient (D) dependent on a temperature based on Equation 2. For example, when Q=2 eV and $D_0 = 8 \times 10^{-5}$ m$^2$/sec, $D \cong 10^{-38}$ m$^2$/sec at 300° K, but it rapidly increases to D=$10^{-11}$ m$^2$/sec at T=1500° K.

Thus, as illustrated in FIG. 13, when assuming that two energies (E1 and E2) having a different temperature are each injected into two points of a silicon substrate, because diffusion coefficients (D1 and D2) for two areas are different from each other (that is, because a diffusion coefficient increases as a temperature increases), degrees of diffusion of impurities are different. Thus, as illustrated in FIG. 5, the silicon substrate is distinguished into the emitter layer 113 and the selective emitter region 114.

The graph of FIG. 13 can be again represented as a graph illustrating a relationship between a log function of a diffusion coefficient and an inverse of a temperature as illustrated in FIG. 14. If Equation 2 is expressed using a log function correspondingly to the graph of FIG. 14, it is given below:

$$\text{Log}D = -\frac{Q}{kT} + \text{Log}D_0 \quad (3)$$

Figure 6:
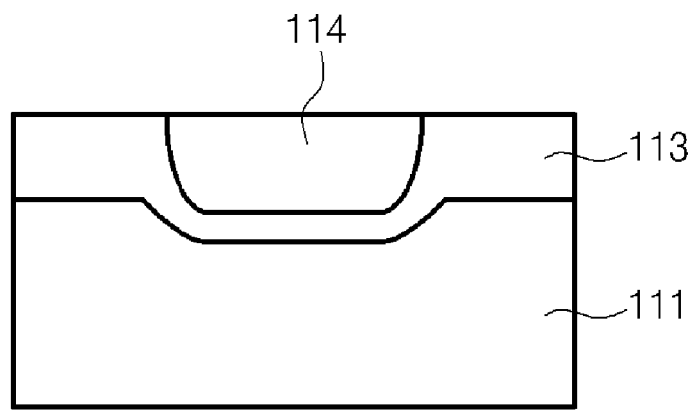
FIG. 6 is a section illustrating a substrate after execution of step 1005 among the process of forming the selective emitter of the solar cell of FIG. 1.

Meantime, a Phosphorus Silicate Glass (PSG) layer 115 can be further formed on the surface of the silicon substrate 111 on which the emitter layer 113 and the selective emitter region 114 are formed in steps 1003 and 1004. Thus, after step 1004, the PSG layer 115 formed on the surface of the silicon substrate 111 including the emitter layer 113 and the selective emitter region 114 is removed (step 1005). In step 1005, the PSG layer 115 can be removed by dipping the silicon substrate 111 in a nitrogen fluoride (NF) solution of 5%. After that, the silicon substrate 111 is washed with de-ionized water. Resultantly, as illustrated in FIG. 6, the silicon substrate 111 including the emitter layer 113 and the selective emitter region 114 is obtained.

As described above, according to the process of forming the selective emitter of the present invention, a high productivity of a solar cell and a photoelectric conversion efficiency of 18% or more can be obtained. Also, it is possible to integrate the method for forming the selective emitter according to the present invention with an automation production equipment of an in-line type enabling mass production.

Figure 7:
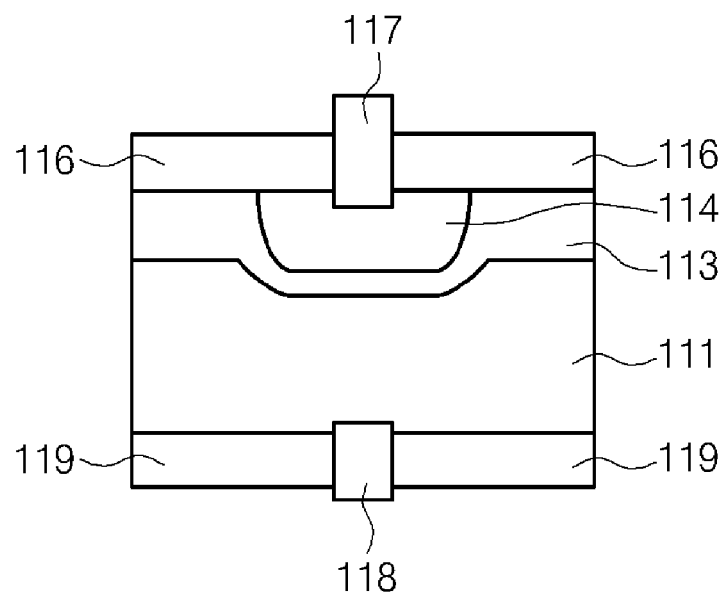
FIG. 7 is a section illustrating an example of a solar cell including a selective emitter formed according to a process of forming a selective emitter of a solar cell according to a first exemplary embodiment of the present invention.

FIG. 7 is a section illustrating an example of a solar cell including a selective emitter formed according to a process of forming a selective emitter of a solar cell according to a first exemplary embodiment of the present invention. An anti-reflection film 116 is formed on a top surface of the silicon substrate 111 illustrated in FIG. 6. The anti-reflection film 116 functions to reduce a reflection of sunlight and enhance an absorption rate of sunlight.

After that, a metal electrode 117 of argentums (Ag−) is printed by a printing machine on the anti-reflection film 116 formed on the selective emitter region 114 and then, is dried and fired. Similarly with this, a metal electrode 118 of argentums aluminum (AgAl) for a bus bar is printed by the printing machine even on a bottom surface of the silicon substrate 111 and then, is dried and fired. Also, a metal electrode 119 of aluminum (Al+) is printed by the printing machine on a bottom surface of the silicon substrate 111 and then, is dried and fired.

By the drying and firing process, as illustrated in FIG. 7, the metal electrode 117 diffused through the overlying anti-reflection film 116 is ohmic-contacted with the selective emitter region 114, and the metal electrode 118 of a rear surface is ohmic-contacted with the silicon substrate 111.

Figure 8:
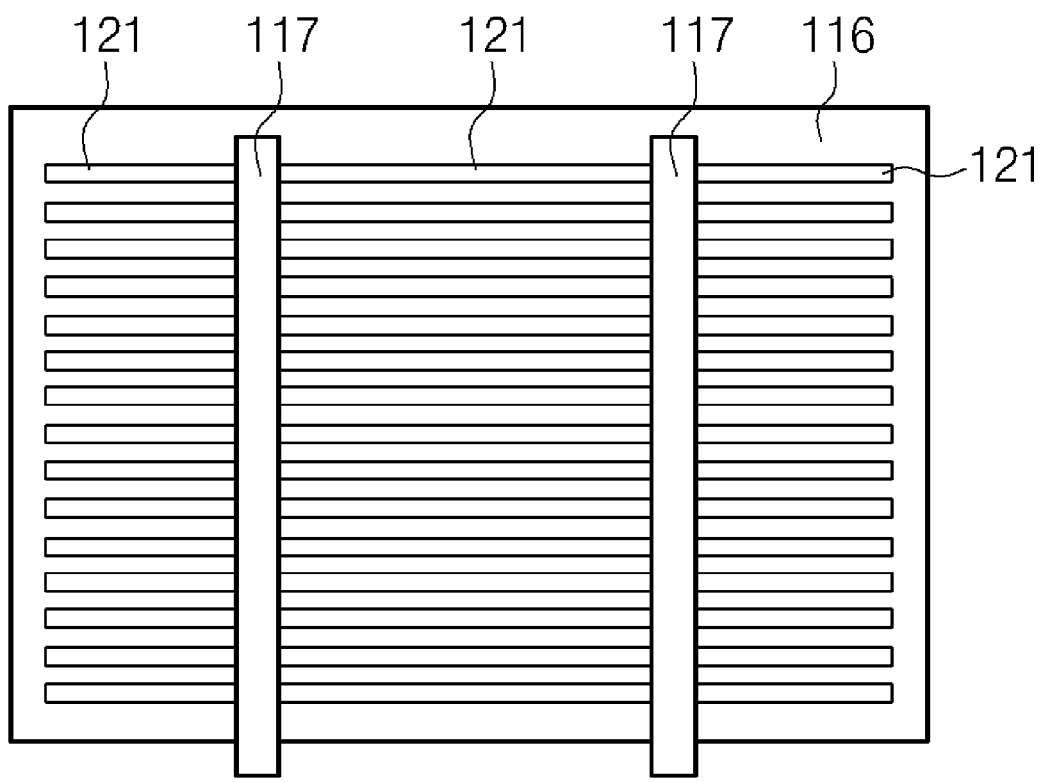
FIG. 8 is a plan diagram illustrating an example of a solar cell including a selective emitter formed according to a process of forming a selective emitter of a solar cell according to a first exemplary embodiment of the present invention.

FIG. 8 is a plan diagram illustrating an example of a solar cell including a selective emitter formed according to a process of forming a selective emitter of a solar cell according to a first exemplary embodiment of the present invention. The metal electrode 117 is diffused through the anti-reflection film 116 and is ohmic-contacted with the selective emitter region 114. Also, finger electrodes 121 are formed at both sides of the metal electrode 117. The selective emitter region 114 is positioned under the metal electrode 117.

FIG. 9 is a longitudinal section illustrating a diffusion apparatus according to an exemplary embodiment of the present invention.

Referring to FIG. 9, the diffusion apparatus 201 includes a conveyer 212, a diffusion chamber 215, a heater 218, a laser generator 219, and an exhaust pump 221.

The conveyer 212 is a unit for supporting a bottom surface of a plurality of silicon substrates while sequentially inputting the plurality of silicon substrates into the diffusion chamber 215, for a continuous diffusion process (i.e., doping process). Also, the conveyer 212 discharges the silicon substrate completing the diffusion process out of the diffusion chamber 215.

The conveyer 212 includes a conveyer belt 213 and a rotating roller 214. As the rotating roller 214 rotates at a set speed, the conveyer belt 213 is circulated and conveyed at a set speed. The conveyer belt 213 is installed to circulate passing through an internal of the diffusion chamber 215. In order to prevent a silicon substrate 100 from being deformed at a high temperature and allow thermal energy to effectively transmit the conveyer belt 213 and be injected into the silicon substrate 100, the conveyer belt 213 is desirably formed of a metal net that can support the whole bottom surface of the silicon substrate 100. The conveyer belt 213 can be formed of metal materials such as Steel Use Stainless (SUS), etc.

The conveyer belt 213 and the rotating roller 214 are supported by a main frame 211. A driving unit (not shown) for driving the conveyer belt 213 and the rotating roller 214, and a control unit (not shown) are installed within the main frame 211.

The conveyer belt 213 mounts the silicon substrate 100 whose surface is textured by an etching process and which is sprayed with an impurity solution 112 or 312. The silicon substrate 100 can be a P-type substrate doped with boron (B)

ions. A plurality of silicon substrates 100 can be mounted at a distance on the conveyer belt 213.

Within the diffusion chamber 215, there is a set space through which the conveyer belt 213 passes. In a diffusion process, an atmosphere of a high temperature enabling effective diffusion of impurity ions into the input silicon substrate 100 is formed in a space within the diffusion chamber 215. An inlet 216 is formed at one side of the diffusion chamber 215, and an outlet 217 is formed at the other side of the diffusion chamber 215.

The rotating roller 214 circulates the conveyer belt 213 such that the silicon substrate 100 mounted on the conveyer belt 213 can be conveyed at a set speed from the inlet 216 of the diffusion chamber 215 to the outlet 217 of the diffusion chamber 215.

Figure 10:
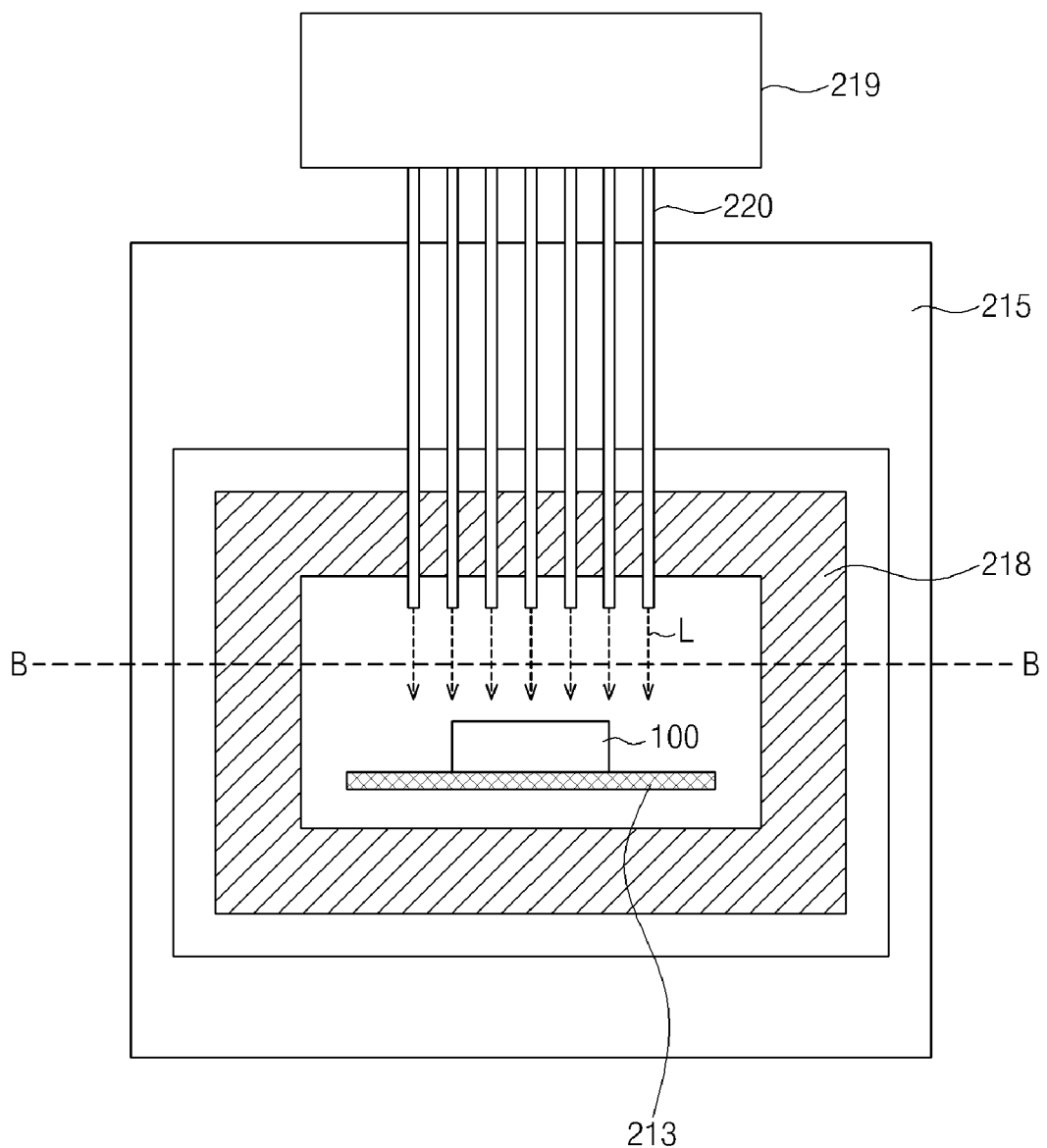
FIG. 10 is a cross section taken along line "A-A" in the diffusion apparatus of FIG. 9.

As illustrated in FIG. 10, the heater 218 is installed to surround the conveyer belt 213 at a set distance from the conveyer belt 213, within the diffusion chamber 215. FIG. 10 is a cross section taken along line "A-A" in the diffusion apparatus of FIG. 9. The heater 218 injects the first thermal energy (E1) into the whole surface of the silicon substrate 100 conveyed to the internal of the diffusion chamber 215. The heater 218 can include a radiative non-contact heater. By a first thermal energy (E1), impurity ions are diffused into the silicon substrate 100 and thus an emitter layer is formed.

The laser generator 219 irradiates a laser beam (L) into a partial region of a surface of the silicon substrate 100, through a plurality of tubes 220. Resultantly, a second thermal energy (E2) is injected into the partial region of the surface of the silicon substrate 100. The second thermal energy (E2) includes the first thermal energy (E1) by the heater 218 and a third thermal energy (E3) by the laser beam (L).

Figure 11:
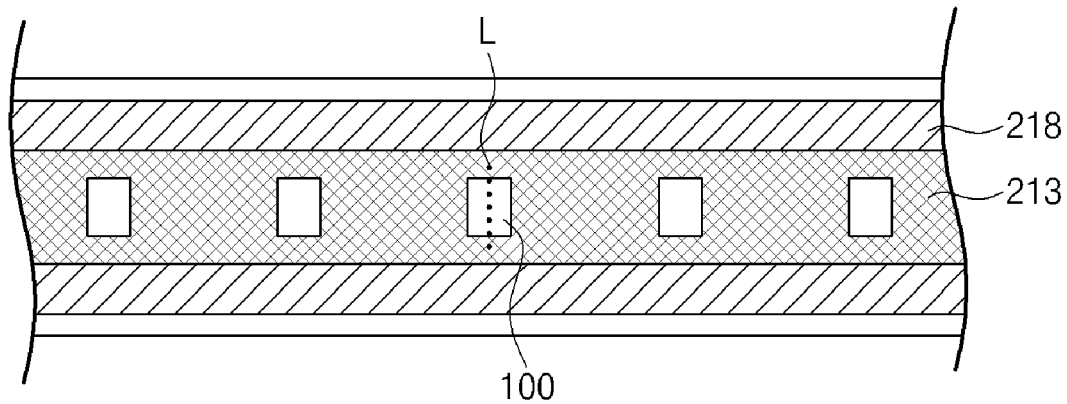
FIG. 11 is a partial plan diagram illustrating an example taken along line "B-B" in the diffusion apparatus of FIG. 10 and then viewed down from a conveyer belt.

As illustrated in FIG. 11, the laser beam (L) is irradiated into a region in which a metal electrode is to be formed in the silicon substrate 100. FIG. 11 is a partial plan diagram illustrating an example taken along line "B-B" in the diffusion apparatus of FIG. 10 and then viewed down from a conveyer belt. By the second thermal energy, the impurity ions are more diffused into the partial region of the emitter layer and thus a selective emitter region is formed.

Figure 12:
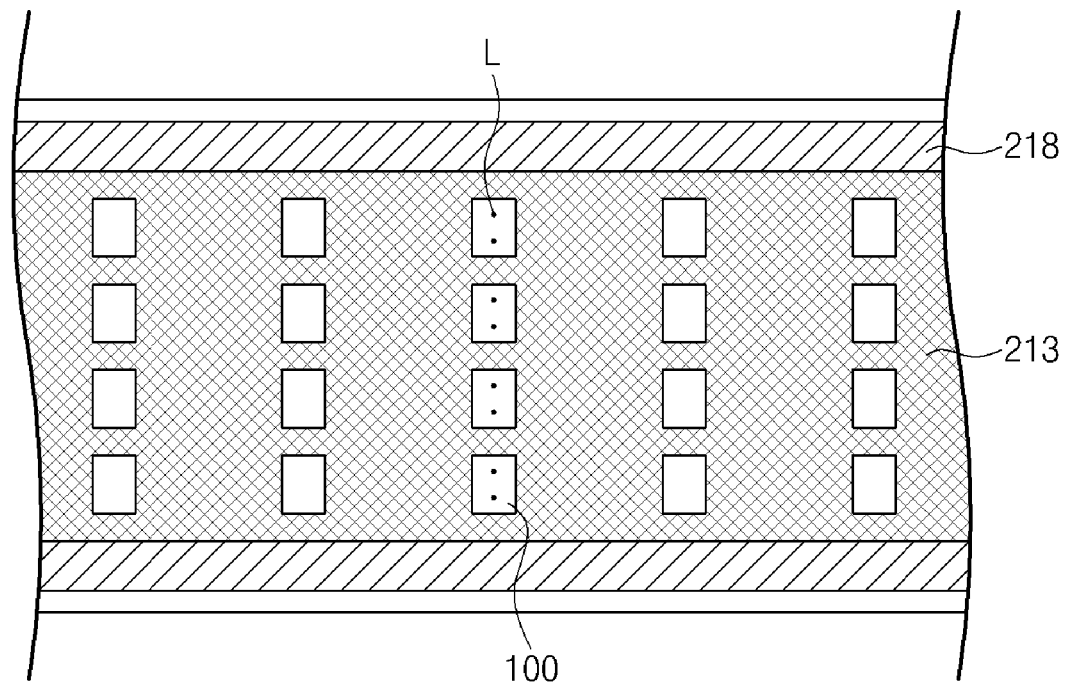
FIG. 12 is a partial plan diagram illustrating another example taken along line "B-B" in the diffusion apparatus of FIG. 10 and then viewed down from a conveyer belt.

FIG. 11 illustrates, as an example, a case where the silicon substrate 100 is mounted in a single line on the conveyer belt 213. However, as illustrated in FIG. 12, the silicon substrate 100 can be also mounted in a plural line on the conveyer belt 213. FIG. 12 is a partial plan diagram illustrating another example taken along line "B-B" in the diffusion apparatus of FIG. 10 and then viewed down from a conveyer belt.

Meantime, as illustrated in FIG. 10, the plurality of tubes 220 are installed to pass through a portion of a top surface of the diffusion chamber 215 and a portion of a top surface of the heater 218 within the diffusion chamber 215 such that each of the plurality of tubes 220 faces the conveyer belt 213 at one end. The exhaust pump 221 discharges out air overheated within the diffusion chamber 215, through an exhaust pipe 222. The exhaust pipe 222 is installed to pass through a portion of the top surface of the diffusion chamber 215 and a portion of the top surface of the heater 218 and extend outside the diffusion chamber 215. Also, the exhaust pump 221 can also discharge out remaining impurities within the diffusion chamber 215.

Figure 15:
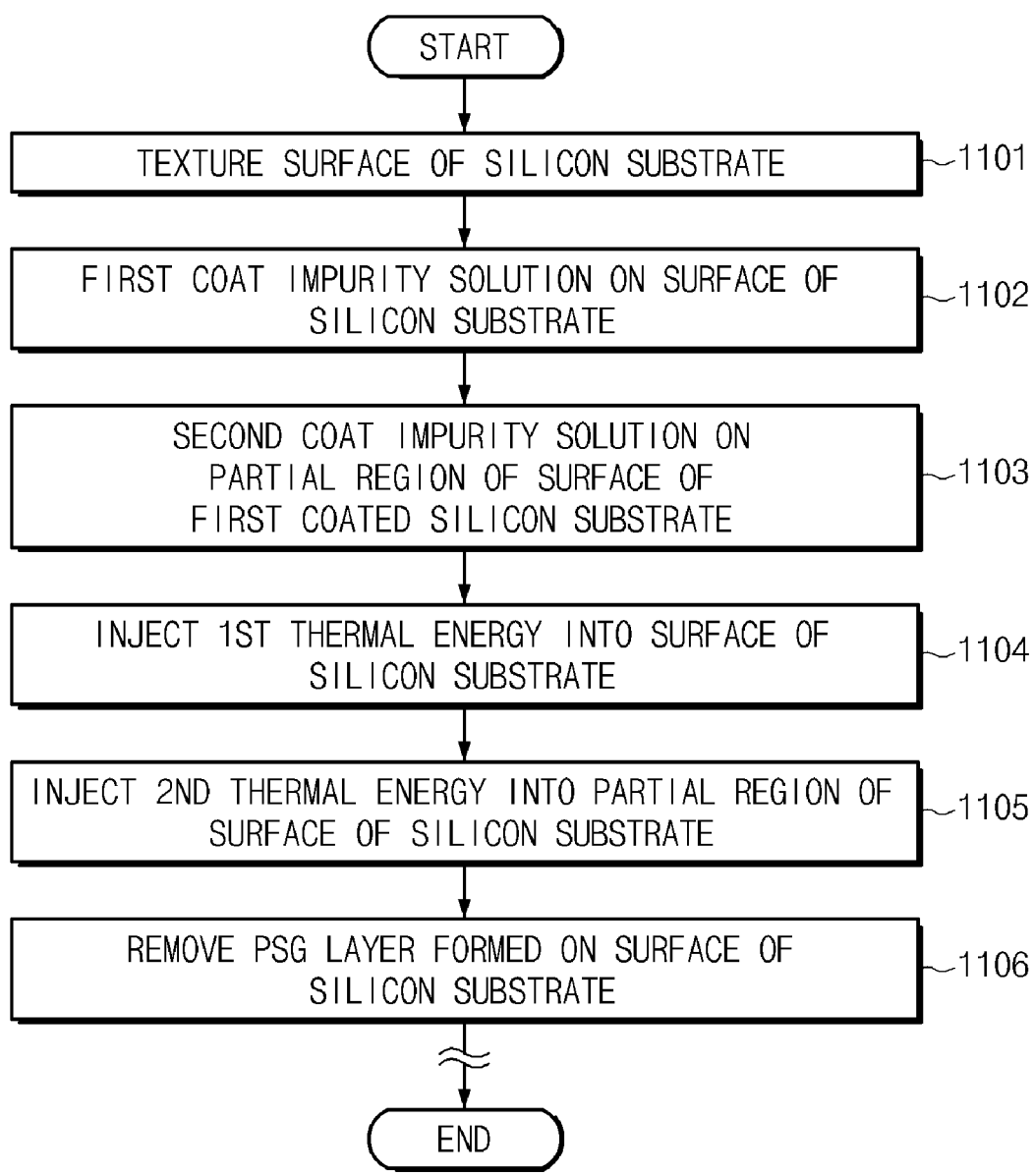
FIG. 15 is a flow diagram illustrating a process of forming a selective emitter of a solar cell according to a second exemplary embodiment of the present invention.

FIG. 15 is a flow diagram illustrating a process of forming a selective emitter of a solar cell according to a second exemplary embodiment of the present invention.

Referring to FIG. 15, a silicon substrate 111 is etched and a surface of the silicon substrate 111 is textured (step 1101).

A treatment process of the silicon substrate 111 in step 1101 is the same as that of step 1001 described above with reference to FIG. 1.

Figure 16:
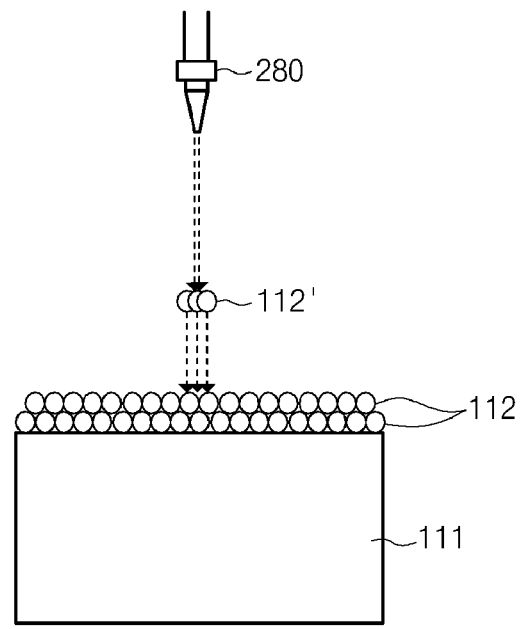
FIG. 16 is a section illustrating a substrate in execution of step 1103 among the process of forming the selective emitter of the solar cell of FIG. 15.

Then, an impurity solution 112 is sprayed on the textured surface of the silicon substrate 111 and thus, as illustrated in FIG. 16, the impurity solution 112 is first coated on the surface of the silicon substrate 111 (step 1102). A treatment process of the silicon substrate 111 in step 1102 is the same as that of step 1002 described above.

Figure 17:
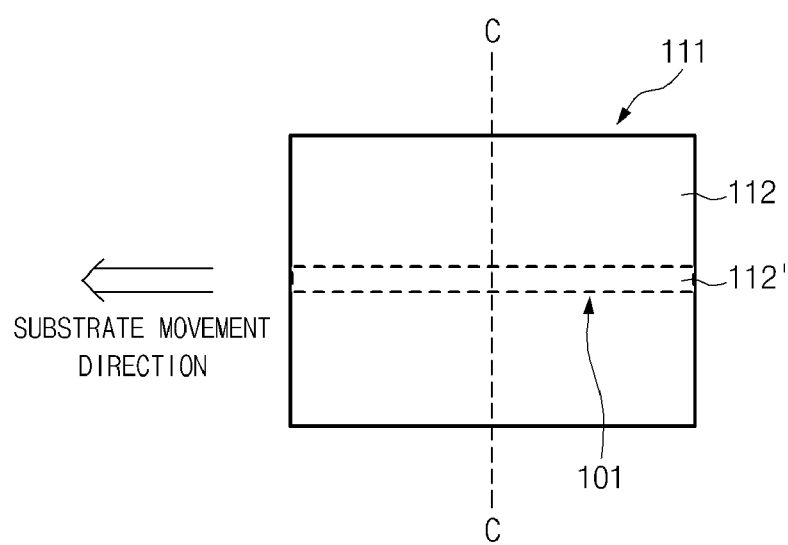
FIG. 17 is a plan diagram illustrating a substrate after execution of step 1103 among the process of forming the selective emitter of the solar cell of FIG. 15.
Figure 18:
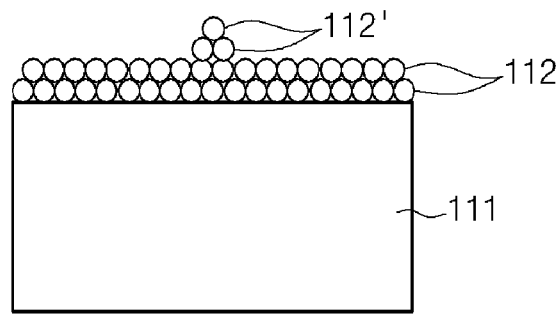
FIG. 18 is a section taken along line "C-C" in the silicon substrate of FIG. 17.

As illustrated in FIG. 16, an impurity solution 112' is second coated on a partial region of the surface of the silicon substrate 111 first coated with the impurity solution 112 (step 1103). By a coating unit 280, the impurity solution 112' is second coated on the silicon substrate 111. As illustrated in FIGS. 17 and 18, if the silicon substrate 111 coated with the impurity solution 112 moves under the coating unit 280, the impurity solution 112' is coated only in a region 101. FIG. 18 is a section taken along line "C-C" in the silicon substrate 111 of FIG. 17. The coating unit 280 can be also installed to be adjacent to the inlet 216 of the diffusion apparatus 201 or 202.

Figure 19:
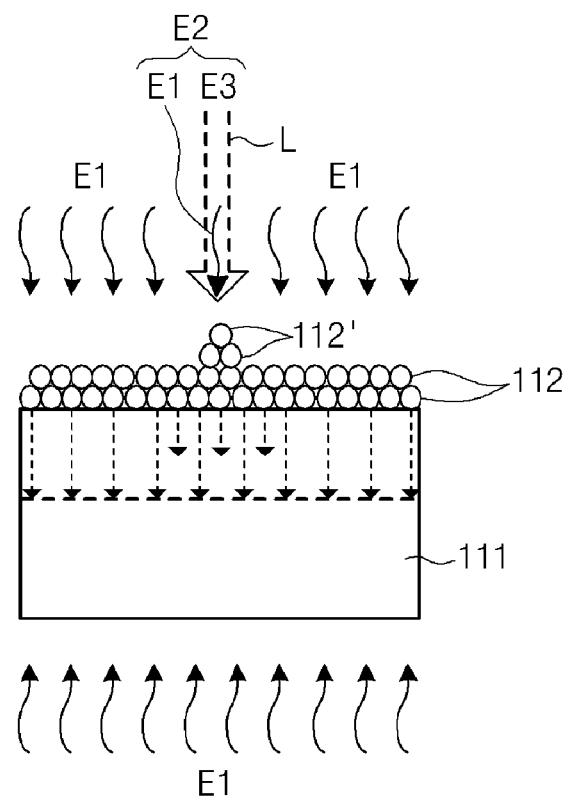
FIG. 19 is a section illustrating a substrate in execution of steps 1104 and 1105 among the process of forming the selective emitter of the solar cell of FIG. 15.

Next, as illustrated in FIG. 19, a first thermal energy (E1) is injected into the whole surface of the silicon substrate 111 coated with the impurity solution 112 and 112' (step 1104). A treatment process of the silicon substrate 111 in step 1104 is the same as that of step 1003 described above with reference to FIG. 1. As a result of execution of step 1104, impurity ions are diffused into the silicon substrate 111 by the first thermal energy (E1) and thus, as illustrated in FIG. 5, an emitter layer 113 is formed. The emitter layer 113 is an N-type doped layer doped with phosphorus (P) ions.

While step 1104 is implemented, that is, while the first thermal energy (E1) is injected into the whole surface of the silicon substrate 111, as illustrated in FIG. 19, a laser beam (L) is irradiated into the surface of the silicon substrate 111 second coated with the impurity solution 112' whereby a second thermal energy (E2) is injected (step 1105). A treatment process of the silicon substrate 111 in step 1105 is the same as that of step 1004 described above with reference to FIG. 1. A temperature (T2) by the second thermal energy (E2) can be set to be in the range of $830° C. \leq T2 \leq 1,070° C.$ The second thermal energy (E2) includes the first thermal energy (E1) by the heater 218 or 232 and a third thermal energy (E3) by the laser beam (L). A temperature (T2) by the second thermal energy (E2) is equal to a temperature by the first thermal energy (E1) and third thermal energy (E3).

As a result of execution of step 1105, the impurity ions are more diffused into the partial region of the emitter layer 113 by the second thermal energy (E2) and thus, as illustrated in FIG. 5, a selective emitter region 114 is formed. The selective emitter region 114 is an N+-type doped region more doped with phosphorus (P) ions than the emitter layer 113. Part of the selective emitter region corresponds to a region in which a metal electrode 117 (FIG. 8) is deposited.

Meantime, a PSG layer 115 can be further formed on the surface of the silicon substrate 111 on which the emitter layer 113 and the selective emitter region 114 are formed in steps 1104 and 1105. Thus, after step 1105, the PSG layer 115 formed on the surface of the silicon substrate 111 including the emitter layer 113 and the selective emitter region 114 is removed (step 1106). A treatment process of the silicon substrate 111 in step 1106 is the same as that of step 1005 described above. Resultantly, as illustrated in FIG. 6, the silicon substrate 111 including the emitter layer 113 and the selective emitter region 114 is obtained.

As described above, in steps 1102 and 1103, the impurity solution 112 is twice coated in a region in which the selective emitter region 114 is to be formed. Thus, when the second thermal energy (E2) is injected into the silicon substrate 111, the selective emitter region 114 of a good quality can be formed.

Figure 20:
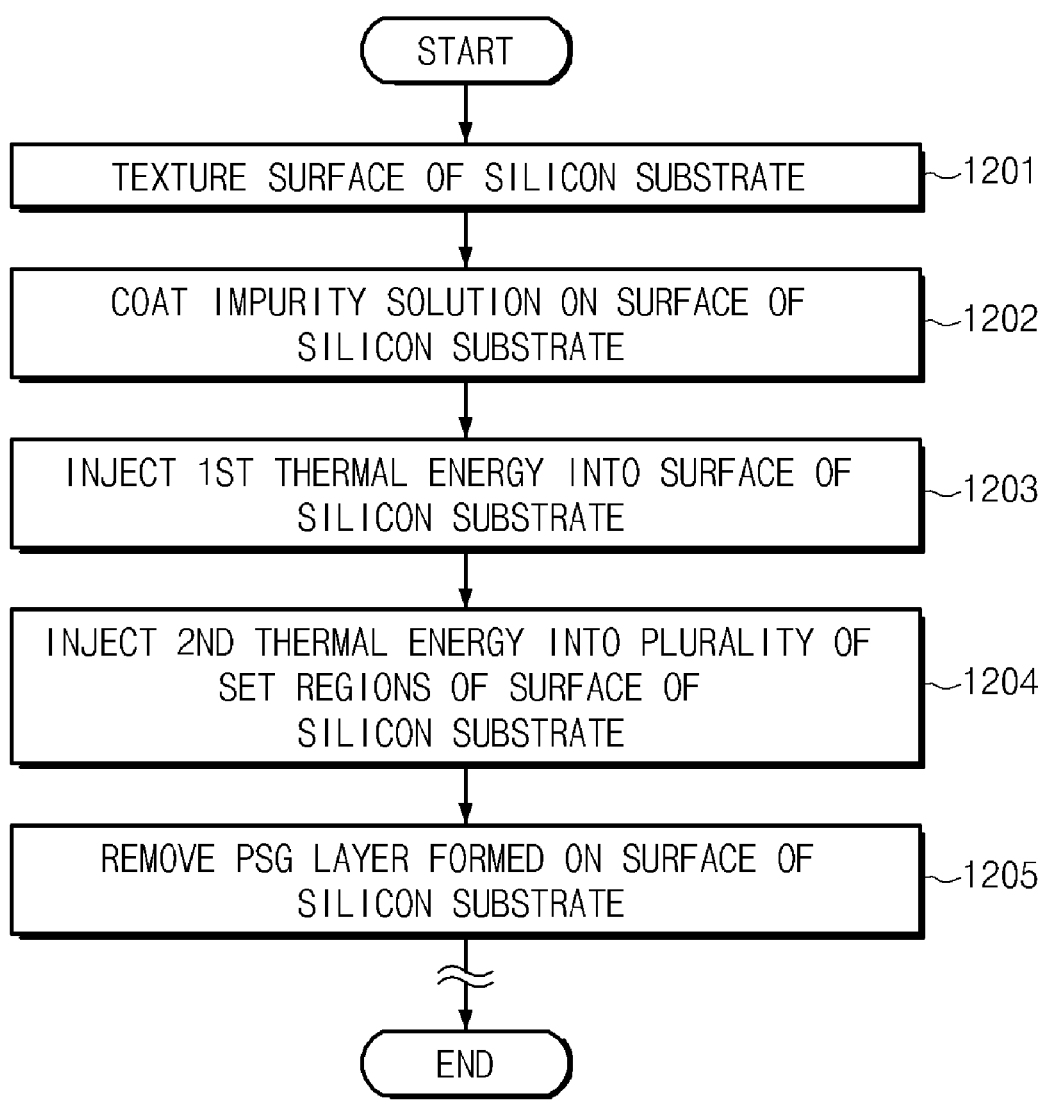
FIG. 20 is a flow diagram illustrating a process of forming a selective emitter of a solar cell according to a third exemplary embodiment of the present invention.

FIG. 20 is a flow diagram illustrating a process of forming a selective emitter of a solar cell according to a third exemplary embodiment of the present invention.

Referring to FIG. 20, a silicon substrate 311 is etched and a surface of the silicon substrate 311 is textured (step 1201). A treatment process of the silicon substrate 311 in step 1201 is the same as that of step 1001 described above with reference to FIG. 1.

Figure 21:
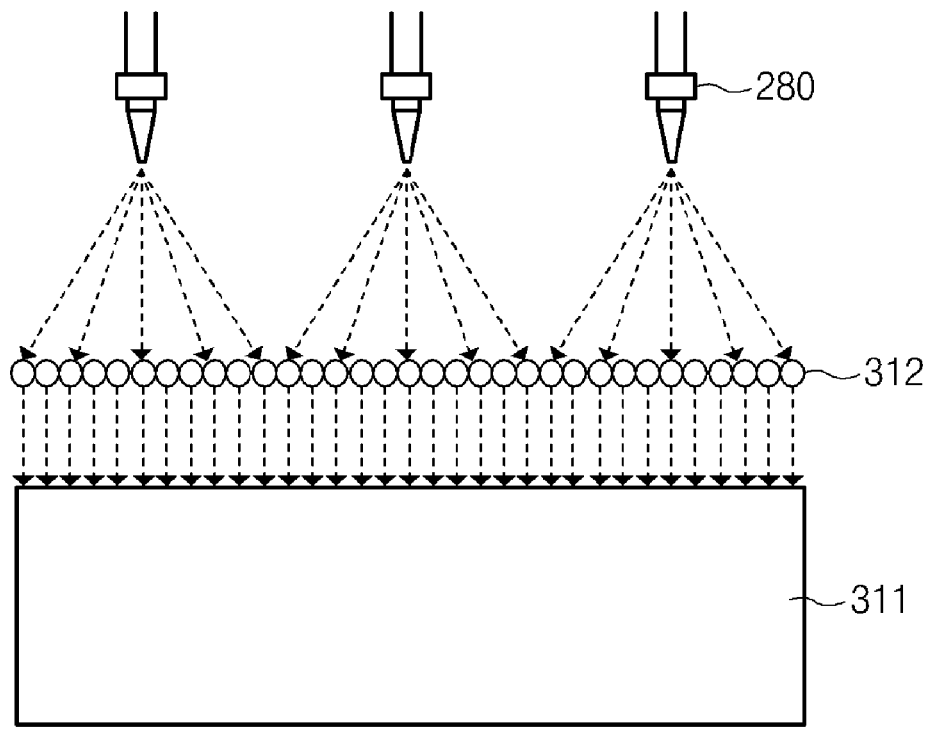
FIG. 21 is a section illustrating a substrate in execution of step 1202 among the process of forming the selective emitter of the solar cell of FIG. 20.
Figure 22:
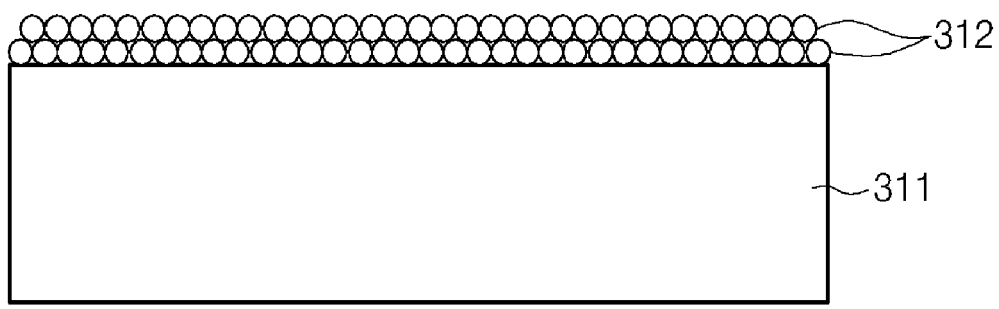
FIG. 22 is a section illustrating a substrate after execution of step 1202 among the process of forming the selective emitter of the solar cell of FIG. 20.

Then, an impurity solution 312 is sprayed on the textured surface of the silicon substrate 311 and thus, as illustrated in FIGS. 21 and 22, the impurity solution 312 is coated on the surface of the silicon substrate 311 (step 1202). A treatment process of the silicon substrate 311 in step 1202 is the same as that of step 1002 described above.

Figure 23:
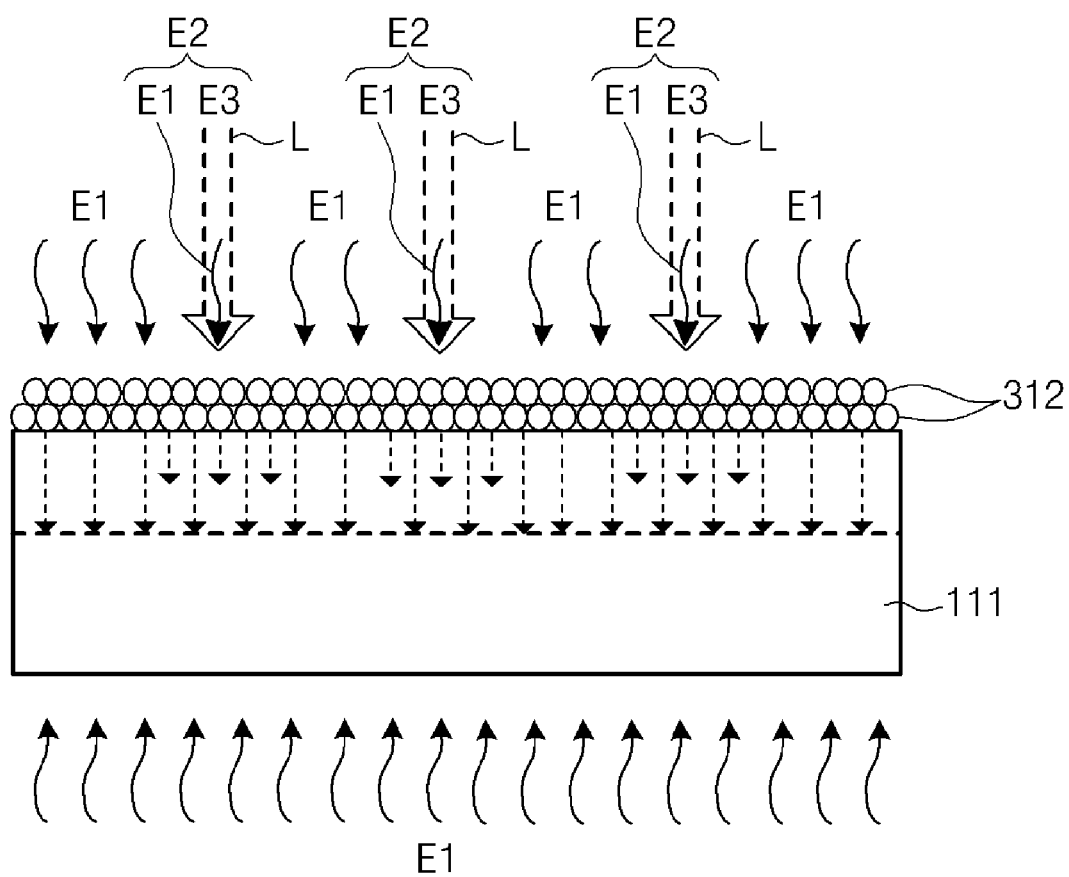
FIG. 23 is a section illustrating a substrate in execution of steps 1203 and 1204 among the process of forming the selective emitter of the solar cell of FIG. 20.
Figure 25:
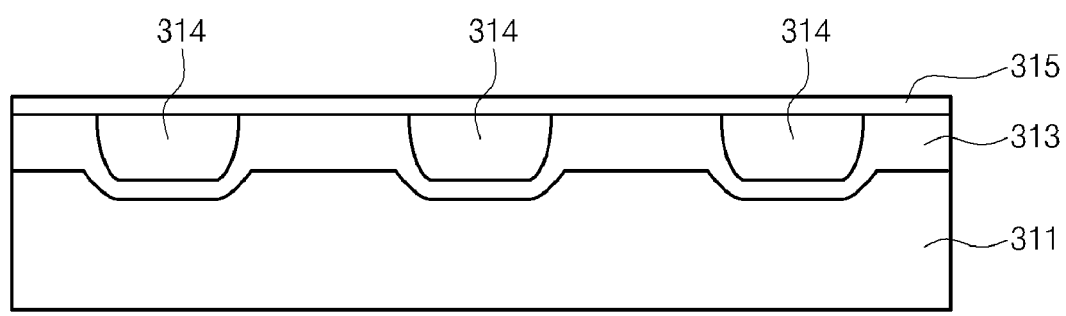
FIG. 25 is a section illustrating a substrate after execution of steps 1203 and 1204 among the process of forming the selective emitter of the solar cell of FIG. 20.

Next, as illustrated in FIG. 23, a first thermal energy (E1) is injected into the whole surface of the silicon substrate 311 coated with the impurity solution 312 (step 1203). Step 1203 can be implemented by the radiative non-contact heater 218 or 232 of the diffusion apparatus 201 or 202. A temperature (T1) by the first thermal energy (E1) can be set to be in the range of 830° C.≦T1≦900° C. As a result of execution of step 1203, impurity ions are diffused into the silicon substrate 311 by the first thermal energy (E1) and thus, as illustrated in FIG. 25, an emitter layer 313 is formed. The emitter layer 313 is an N-type doped layer doped with phosphorus (P) ions.

Figure 24:
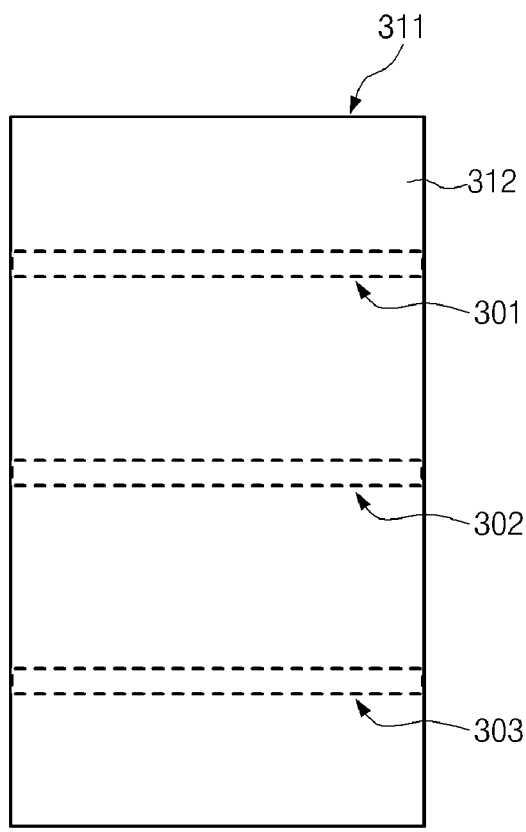
FIG. 24 is a plan diagram illustrating a substrate in execution of steps 1203 and 1204 among the process of forming the selective emitter of the solar cell of FIG. 20.

While step 1203 is implemented, that is, while the first thermal energy (E1) is injected into the whole surface of the silicon substrate 311, as illustrated in FIG. 23, a laser beam (L) is irradiated into a plurality of set regions 301 to 303 (FIG. 24) of the surface of the silicon substrate 311 coated with the impurity solution 312 whereby a second thermal energy (E2) is injected (step 1204). Step 1204 can be implemented by the radiative non-contact heater 218 or 232 of the diffusion apparatus 201 or 202 and a laser generator 219 or 238. A temperature (T2) by the second thermal energy (E2) can be set to be in the range of 830° C.≦T2≦1,070° C. The second thermal energy (E2) includes the first thermal energy (E1) by the heater 218 or 232 and a third thermal energy (E3) by the laser beam (L). A temperature (T2) by the second thermal energy (E2) is equal to a temperature by the first thermal energy (E1) and third thermal energy (E3).

Figure 29:
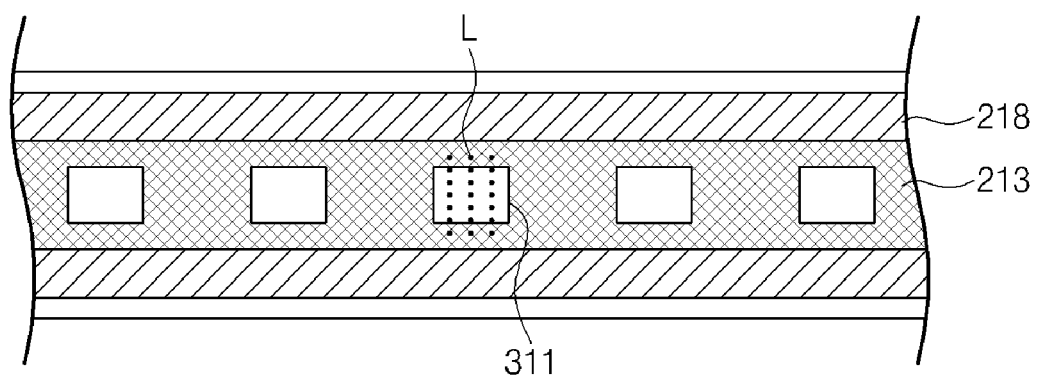
FIG. 29 is a partial plan diagram illustrating another example taken along line "B-B" in the diffusion apparatus of FIG. 10 and then viewed down from a conveyer belt.
Figure 30:
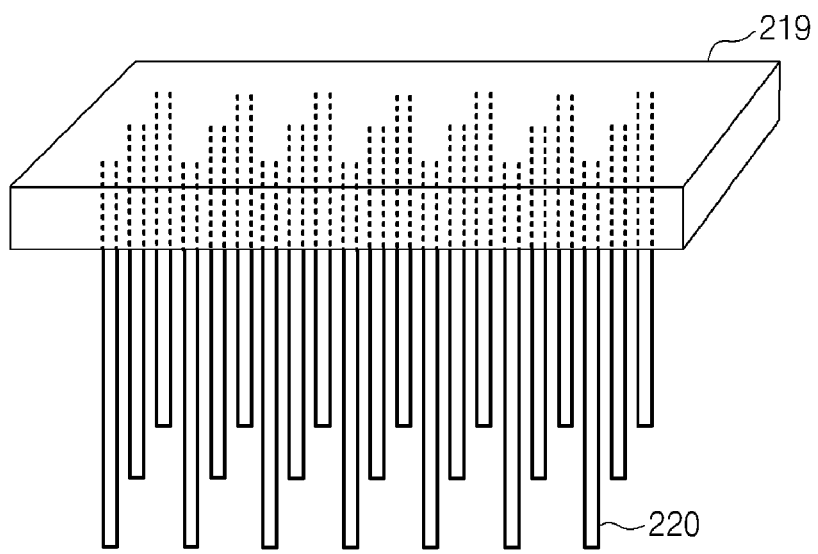
FIG. 30 is a perspective diagram illustrating another example of a laser generator illustrated in FIG. 9
Figure 31:
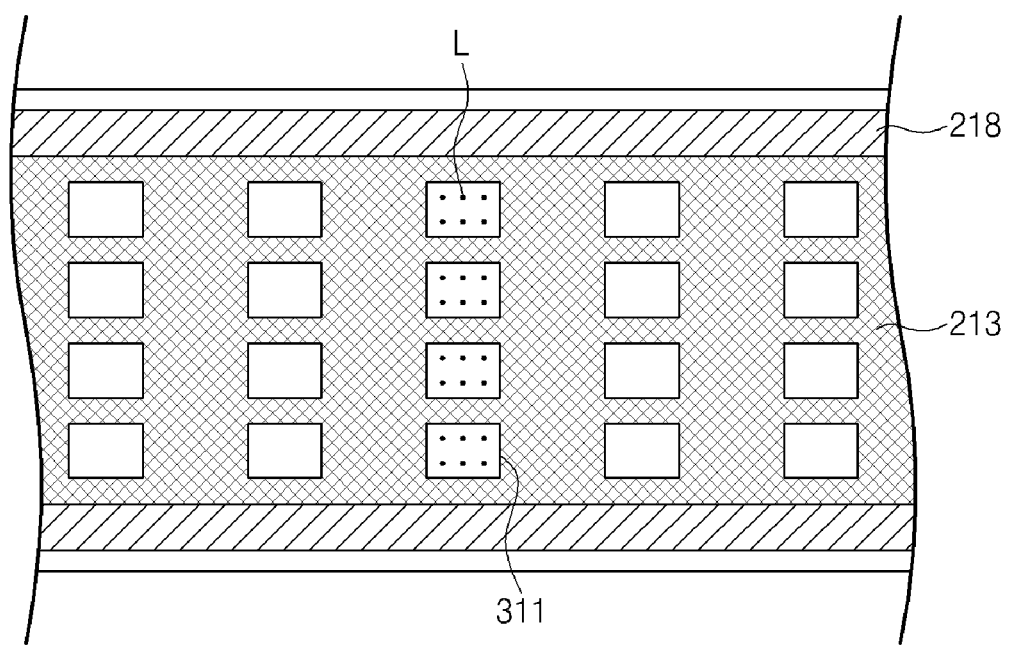
FIG. 31 is a partial plan diagram illustrating a further another example taken along line "B-B" in the diffusion apparatus of FIG. 10 and then viewed down from a conveyer belt.

In step 1204, as illustrated in FIG. 29, a laser beam (L) of a plural line can be each irradiated into a plurality of set regions 301 to 303 of the surface of the silicon substrate 311. As illustrated in FIG. 30, the laser generator 219 used in step 1204 can irradiate the laser beam (L) into the plurality of set regions 301 to 303 of the surface of the silicon substrate 311, through a tube 220 of a plural line. FIG. 29 illustrates as an example a case in which the silicon substrate 311 is mounted in a single line on the conveyer belt 213. However, as illustrated in FIG. 31, the silicon substrate 311 can be also mounted in a plural line on the conveyer belt 213. FIG. 31 is a partial plan diagram illustrating a further another example of the diffusion apparatus of FIG. 10 taken along line "B-B" and then viewed down from a conveyer belt 213.

As a result of execution of step 1204, the impurity ions are more diffused into the partial region of the emitter layer 313 by the second thermal energy (E2) and thus, as illustrated in FIG. 25, a selective emitter region 314 is formed. The selective emitter region 314 is an N+-type doped region more doped with phosphorus (P) ions than the emitter layer 313. At least one of a region in which the selective emitter region 314 is formed corresponds to a region in which a metal electrode 317 (FIG. 27) is not formed, and a remaining region corresponds to a region in which the metal electrode 317 is formed.

Figure 26:
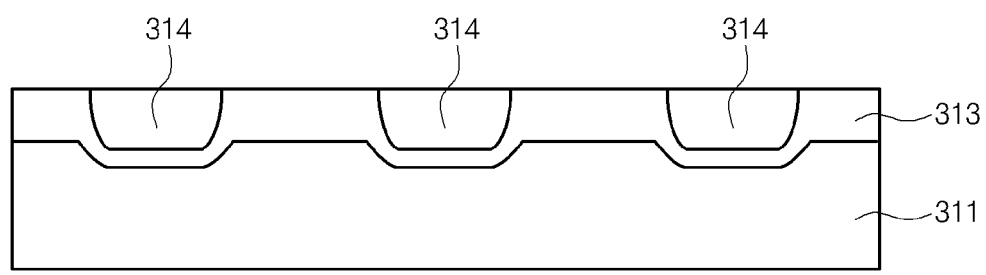
FIG. 26 is a section illustrating a substrate after execution of step 1205 among the process of forming the selective emitter of the solar cell of FIG. 20.

Meantime, a PSG layer 315 can be further formed on the surface of the silicon substrate 311 on which the emitter layer 313 and the selective emitter region 314 are formed in steps 1203 and 1204. Thus, after step 1204, the PSG layer 315 formed on the surface of the silicon substrate 311 including the emitter layer 313 and the selective emitter region 314 is removed (step 1205). A treatment process of the silicon substrate 311 in step 1205 is the same as that of step 1005 described above. Resultantly, as illustrated in FIG. 26, the silicon substrate 311 including the emitter layer 313 and the selective emitter region 314 is obtained.

Figure 27:
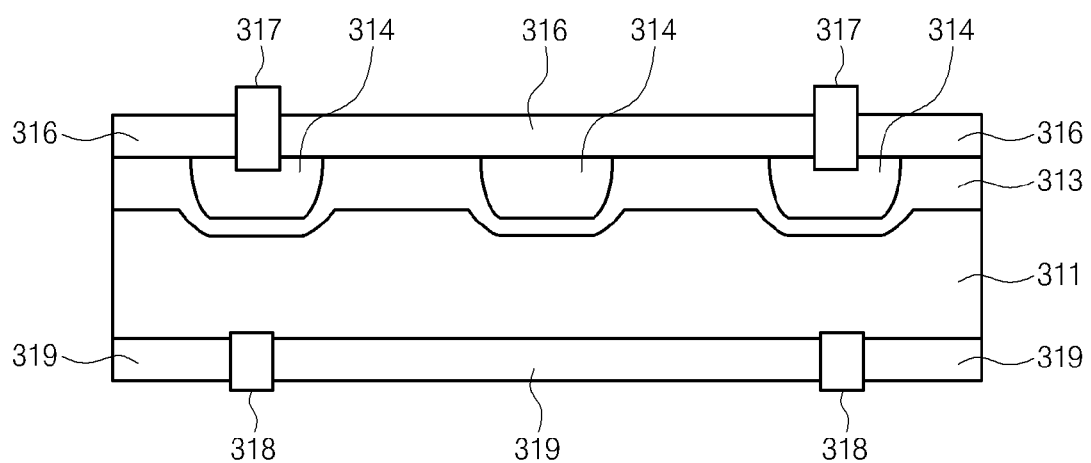
FIG. 27 is a section illustrating an example of a solar cell including a selective emitter formed according to a process of forming a selective emitter of a solar cell according to a third exemplary embodiment of the present invention.

FIG. 27 is a section illustrating an example of a solar cell including a selective emitter formed according to a process of forming a selective emitter of a solar cell according to a third exemplary embodiment of the present invention. An anti-reflection film 316 is formed on a top surface of the silicon substrate 311 of FIG. 26. The anti-reflection film 316 functions to reduce a reflection of sunlight and enhance an absorption rate of sunlight.

After that, at both sides of a selective emitter region 314 formed at a center of the silicon substrate 311, metal electrodes 317 of argentums (Ag–) are printed by a printing machine in the anti-reflection film 316 on selective emitter regions 314 formed at a set distance and then, are dried and fired. Similarly with this, metal electrodes 318 of argentums aluminum (AgAl) for a bus bar are printed by the printing machine even on a bottom surface of the silicon substrate 311 and then, are dried and fired. Also, a metal electrode 319 of aluminum (Al+) is printed by the printing machine on a bottom surface of the silicon substrate 311 and then, is dried and fired.

By the drying and firing process, as illustrated in FIG. 27, the metal electrodes 317 diffused through the overlying anti-reflection film 316 are ohmic-contacted with the selective emitter regions 314, and the metal electrodes 318 of a rear surface are ohmic-contacted with the silicon substrate 311.

Figure 28:
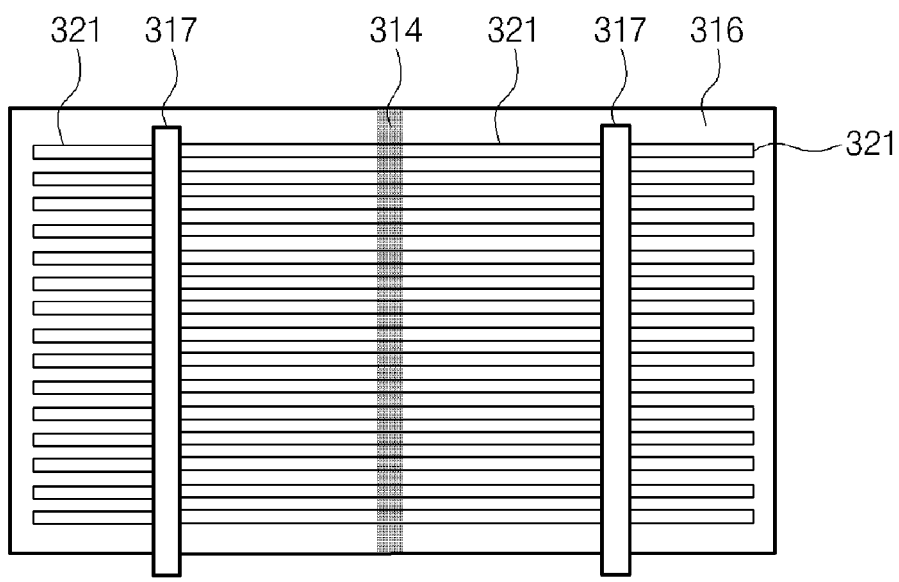
FIG. 28 is a plan diagram illustrating an example of a solar cell including a selective emitter formed according to a process of forming a selective emitter of a solar cell according to a third exemplary embodiment of the present invention.

FIG. 28 is a plan diagram illustrating an example of a solar cell including a selective emitter formed according to a process of forming a selective emitter of a solar cell according to a third exemplary embodiment of the present invention. The metal electrode 317 is diffused through the anti-reflection film 316 and is ohmic-contacted with the selective emitter region 314. Also, finger electrodes 321 are formed at both sides of the metal electrode 317. The selective emitter region 314 is positioned under the metal electrode 317. Meantime, the selective emitter region 314 is positioned even in a partial region under the finger electrodes 321 formed between the metal electrodes 317. As number of the selective emitter regions 314 formed in the silicon substrate 311 increases, a photoelectric conversion efficiency of the solar cell can more increase.

Figure 32:
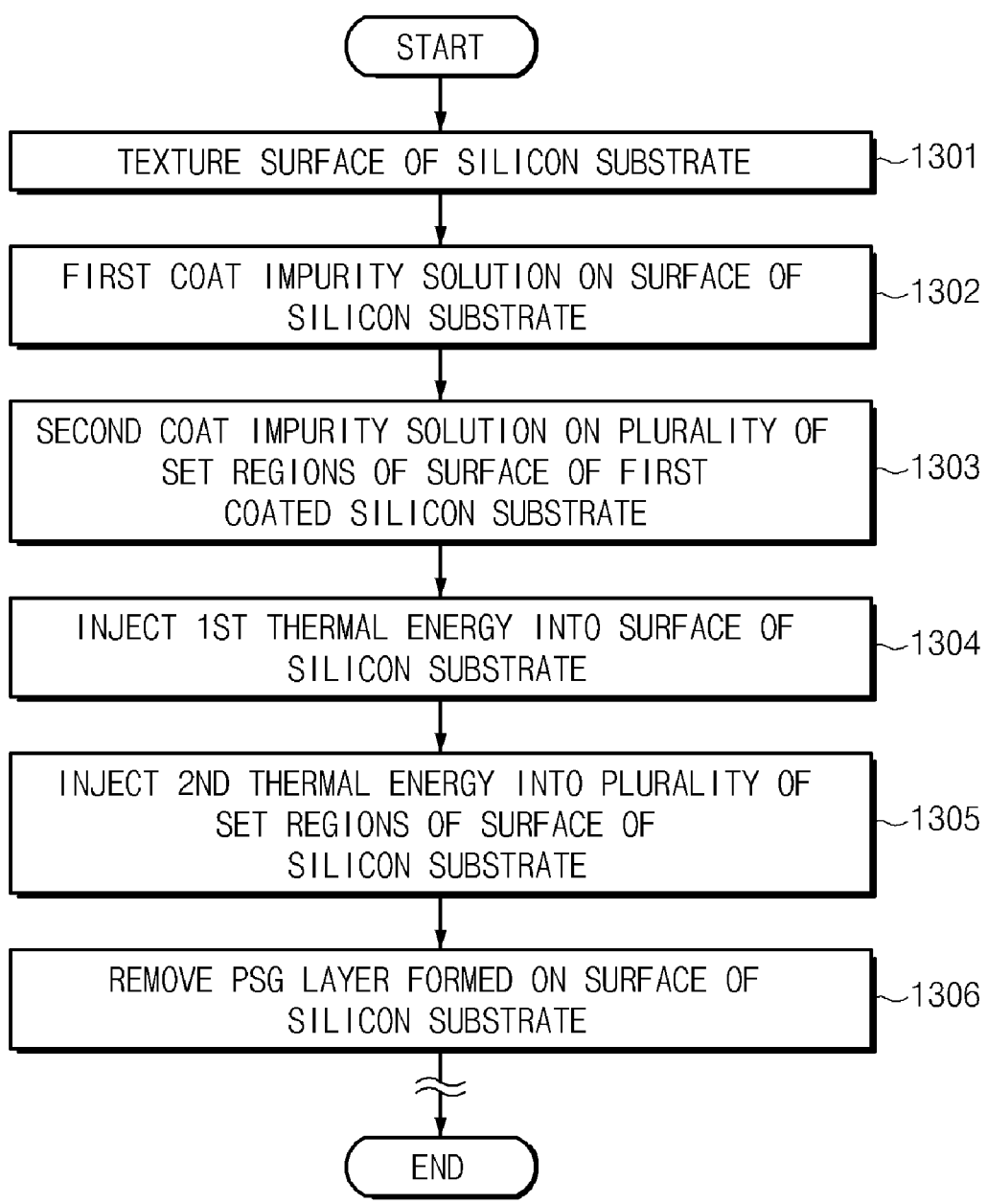
FIG. 32 is a flow diagram illustrating a process of forming a selective emitter of a solar cell according to a fourth exemplary embodiment of the present invention.

FIG. 32 is a flow diagram illustrating a process of forming a selective emitter of a solar cell according to a fourth exemplary embodiment of the present invention.

Referring to FIG. 32, a silicon substrate 311 is etched and a surface of the silicon substrate 311 is textured (step 1301). A treatment process of the silicon substrate 311 in step 1301 is the same as that of step 1001 described above with reference to FIG. 1.

Figure 33:
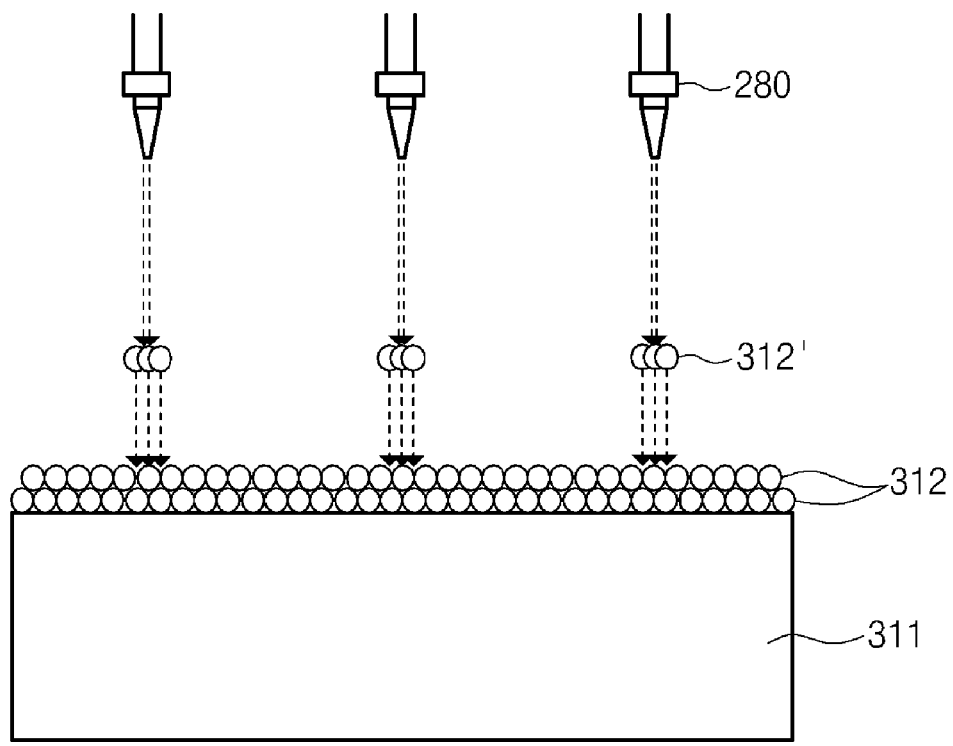
FIG. 33 is a section illustrating a substrate in execution of step 1303 among the process of forming the selective emitter of the solar cell of FIG. 32.
Figure 34:
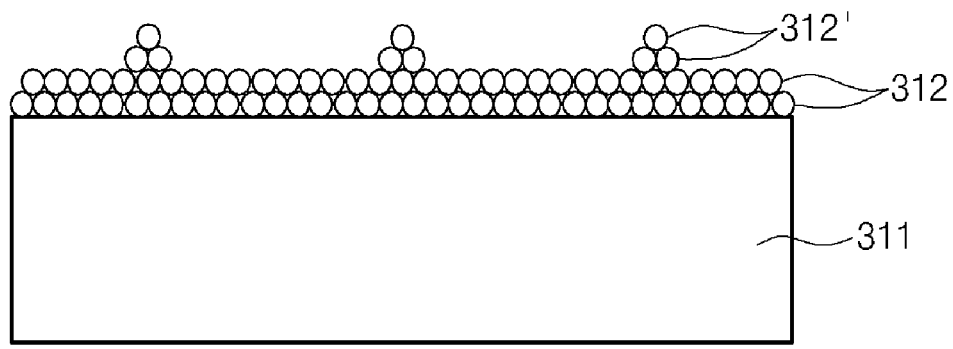
FIG. 34 is a section illustrating a substrate after execution of step 1303 among the process of forming the selective emitter of the solar cell of FIG. 32.

Then, an impurity solution 312 is sprayed on the textured surface of the silicon substrate 311 and thus, as illustrated in FIG. 33, the impurity solution 312 is first coated on the surface of the silicon substrate 311 (step 1302). A treatment process of the silicon substrate 311 in step 1302 is the same as that of step 1002 described above.

Figure 35:
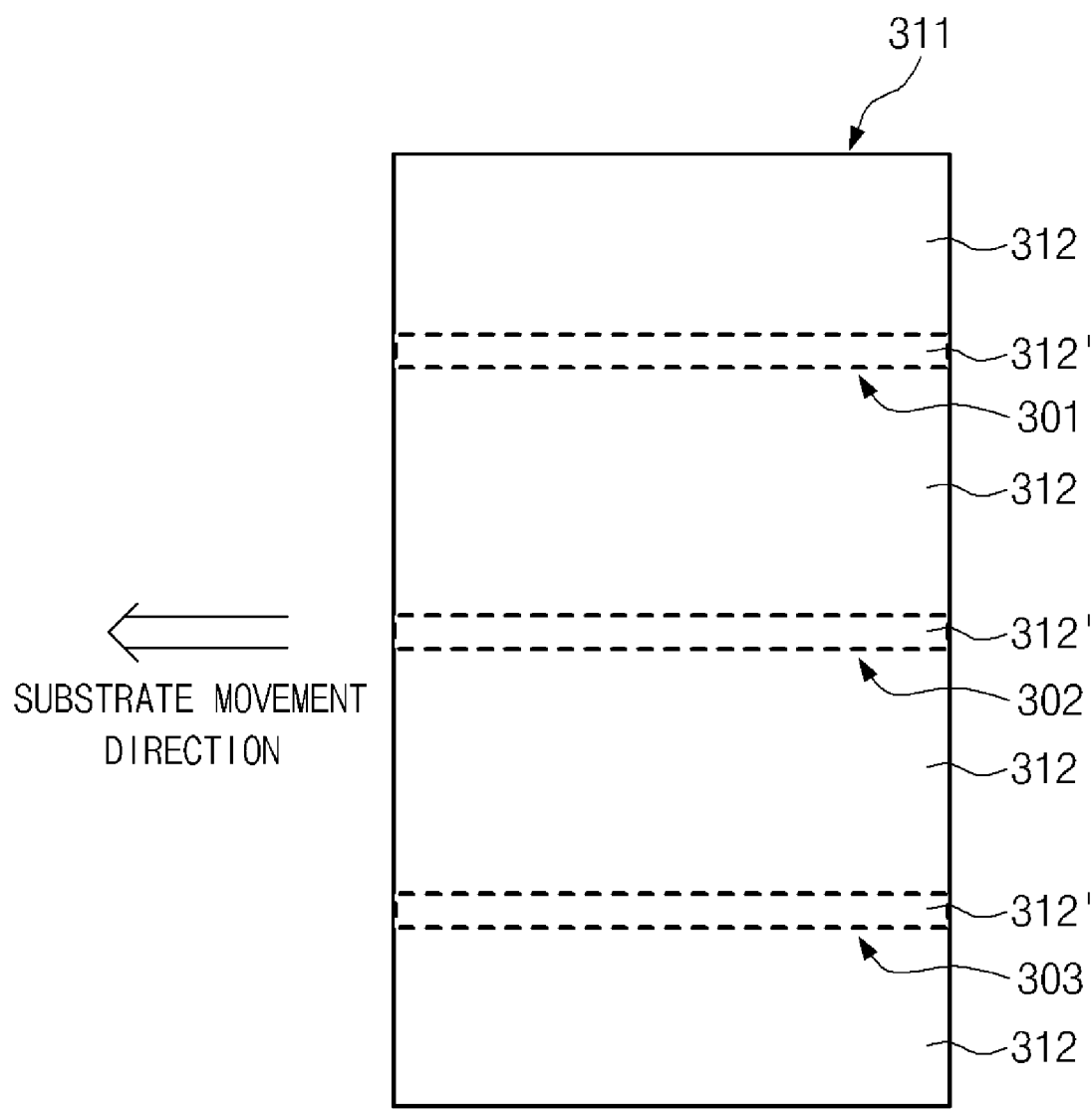
FIG. 35 is a plan diagram illustrating a substrate after execution of step 1303 among the process of forming the selective emitter of the solar cell of FIG. 32.

As illustrated in FIG. 33, an impurity solution 312' is second coated in a plurality of set regions 301 to 303 (FIG. 35) of a surface of the silicon substrate 311 first coated with the impurity solution 312 (step 1303). By a coating unit 280, the impurity solution 312' is second coated on the silicon substrate 311. As illustrated in FIG. 35, if the silicon substrate 311 coated with the impurity solution 312 moves under the coating unit 280, the impurity solution 312' is coated only in regions 301 to 303.

Figure 36:
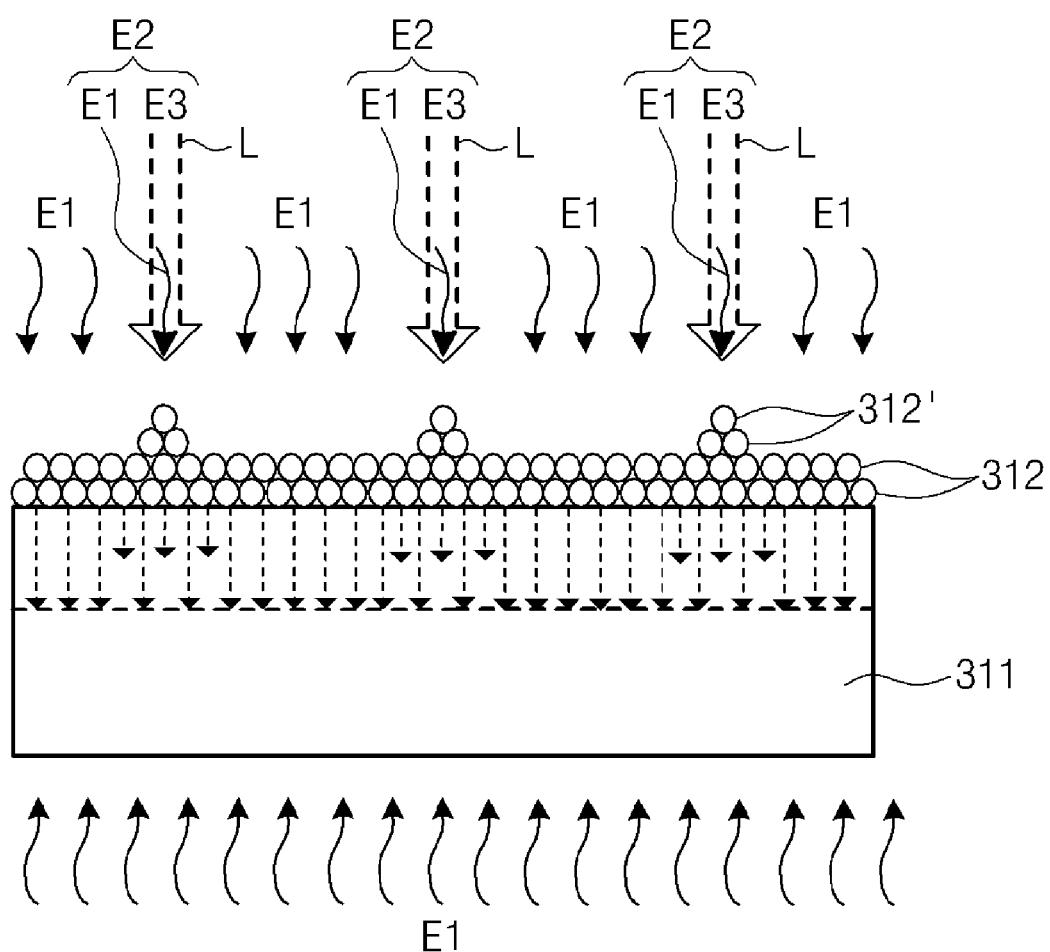
FIG. 36 is a section illustrating a substrate in execution of steps 1304 and 1305 among the process of forming the selective emitter of the solar cell of FIG. 32.

Next, as illustrated in FIG. 36, a first thermal energy (E1) is injected into the whole surface of the silicon substrate 311 coated with the impurity solution 312 and 312' (step 1304). A treatment process of the silicon substrate 311 in step 1304 is the same as that of step 1003 described above with reference to FIG. 1. As a result of execution of step 1304, impurity ions are diffused into the silicon substrate 311 by the first thermal energy (E1) and thus, as illustrated in FIG. 25, an emitter layer 313 is formed. The emitter layer 313 is an N-type doped layer doped with phosphorus (P) ions.

While step 1304 is implemented, that is, while the first thermal energy (E1) is injected into the whole surface of the silicon substrate 311, as illustrated in FIG. 36, a laser beam (L) is irradiated into the surface of the silicon substrate 311 second coated with the impurity solution 312' whereby a second thermal energy (E2) is injected (step 1305). A treatment process of the silicon substrate 311 in step 1305 is the same as that of step 1004 described above with reference to FIG. 1. A temperature (T2) by the second thermal energy (E2) can be set to be in the range of 830° C.≦T2≦1,070° C. The second thermal energy (E2) includes the first thermal energy (E1) by the heater 218 or 232 and a third thermal energy (E3) by the laser beam (L). A temperature (T2) by the second thermal energy (E2) is equal to a temperature by the first thermal energy (E1) and third thermal energy (E3).

As a result of execution of step 1305, the impurity ions are more diffused into a partial region of the emitter layer 313 by the second thermal energy (E2) and thus, as illustrated in FIG. 25, a selective emitter region 314 is formed. The selective emitter region 314 is an N+-type doped region more doped with phosphorus (P) ions than the emitter layer 313. At least one of the plurality of set regions in which the selective emitter region 314 is formed corresponds to a region in which a metal electrode 317 (FIG. 27) is not deposited, and a remaining region corresponds to a region in which the metal electrode 317 is deposited.

Meantime, a PSG layer 315 can be further formed on the surface of the silicon substrate 311 on which the emitter layer 313 and the selective emitter region 314 are formed in steps 1304 and 1305. Thus, after step 1305, the PSG layer 315 formed on the surface of the silicon substrate 311 including the emitter layer 313 and the selective emitter region 314 is removed (step 1306). A treatment process of the silicon substrate 311 in step 1306 is the same as that of step 1005 described above. Resultantly, as illustrated in FIG. 26, the silicon substrate 311 including the emitter layer 313 and the selective emitter region 314 is obtained.

As described above, in steps 1302 and 1303, the impurity solution 312 is twice coated in a region in which the selective emitter region 314 is to be formed and thus, when the second thermal energy (E2) is injected into the silicon substrate 311, the selective emitter region 314 of a good quality can be formed.

FIG. 37 is a longitudinal section illustrating a diffusion apparatus according to another exemplary embodiment of the present invention.

Referring to FIG. 37, the diffusion apparatus 202 includes a conveyer 212, a diffusion chamber 231, a heater 232, a laser generator 238, and an exhaust pump 221. Constructions and detailed operations of the conveyer 212 and the exhaust pump 221 are the same as those described above with reference to FIG. 9. Thus, to avoid the duplication of description, a description of constructions and detailed operations of the conveyer 212 and the exhaust pump 221 is omitted.

Figure 38:
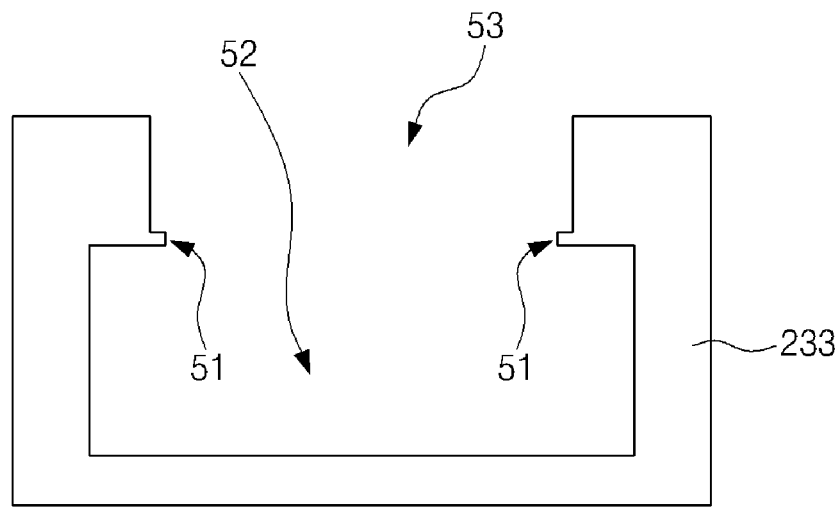
FIG. 38 is a cross section of a housing taken along line "A-A" in the diffusion apparatus of FIG. 37.

The diffusion chamber 231 includes a housing 233, a quartz plate 234, and a heat insulator 235. An inlet 216 is formed at one side of the housing 233, and an outlet 217 is formed at the other side of the housing 233. As illustrated in FIG. 38, a cross section of the housing 233 is a 'U'-like shape. Within the housing 233, there is a set space 52 through which the conveyer belt 213 passes. The conveyer belt 213 circulates passing through the inlet 216, set space 52, and outlet 217 of the housing 233.

Figure 39:
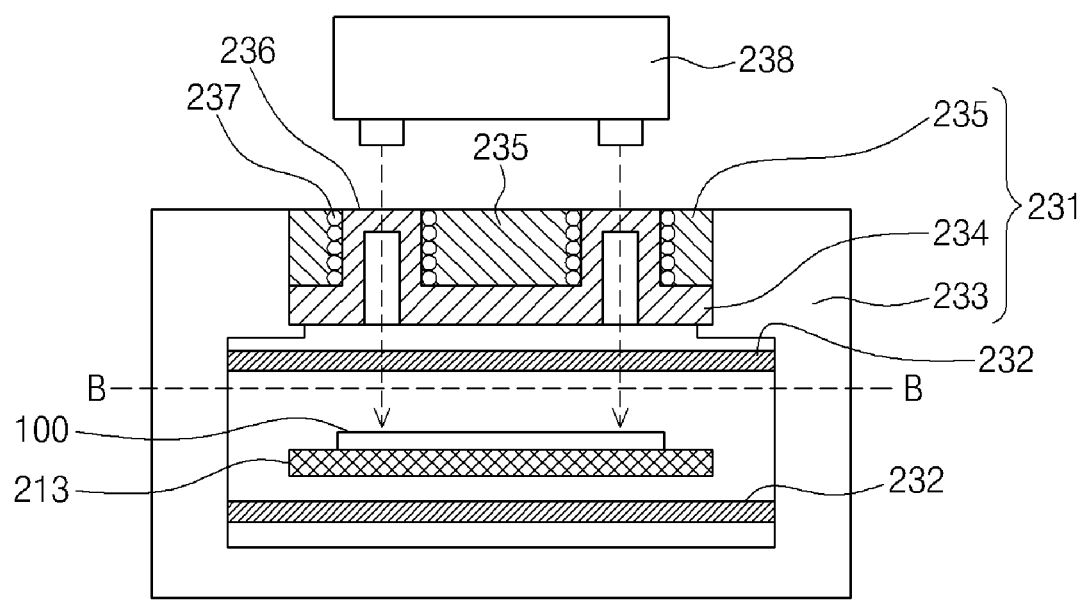
FIG. 39 is a cross section taken along line "A-A" in the diffusion apparatus of FIG. 37.

As illustrated in FIG. 39, the heater 232 is spaced a set distance apart from the conveyer belt 213 within the space 52 of the housing 233 and is installed at a top and bottom of the conveyer belt 213. The heater 232 can be realized by a plurality of radiative non-contact heat lines. The plurality of non-contact heat lines are each installed to be spaced a set distance apart along the conveyer belt 213 and be at right angles with the conveyer belt 213. The plurality of non-contact heat lines generate a uniform first thermal energy (E1) within the diffusion chamber 231.

A plurality of quartz plates 234 are housed in an opening part 53 formed at a portion of a top of the housing 233. The plurality of quartz plates 234 are supported by supports 51 formed at both sides of the top of the housing 233 (FIGS. 38 and 39). The support 51 is protruded from an internal surface of the housing 233. The plurality of quartz plates 234 are disposed to be spaced a set distance apart from each other. The heat insulator 235 is filled in a void space between the plurality of quartz plates 234 and at a top of the plurality of quartz plates 234. The heat insulator 235 is also supported by the support 51. A top of the set space 52 (that is, first set space) is sealed by housing the plurality of quartz plates 234 and the heat insulator 235 within the opening part 53 (that is, second set space).

Figure 40:
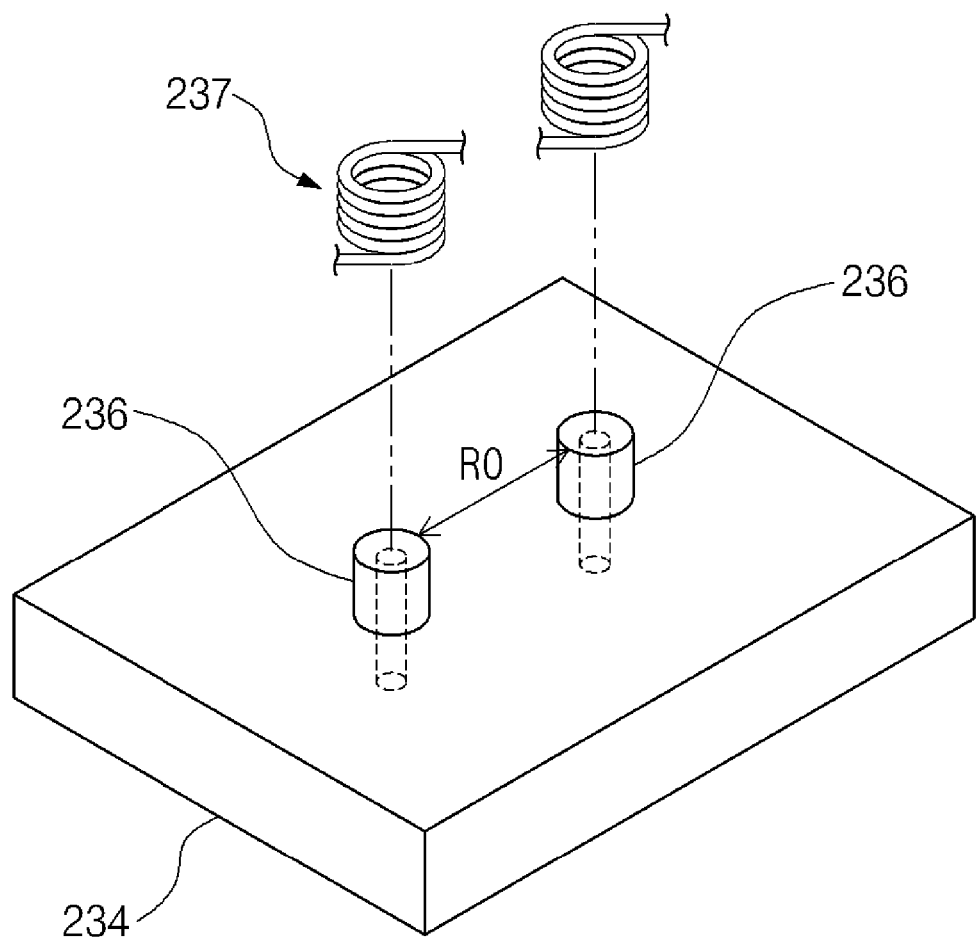
FIG. 40 is a perspective diagram illustrating a quartz plate, a transmittance unit, and a cooling unit illustrated in FIG. 39.
Figure 41:
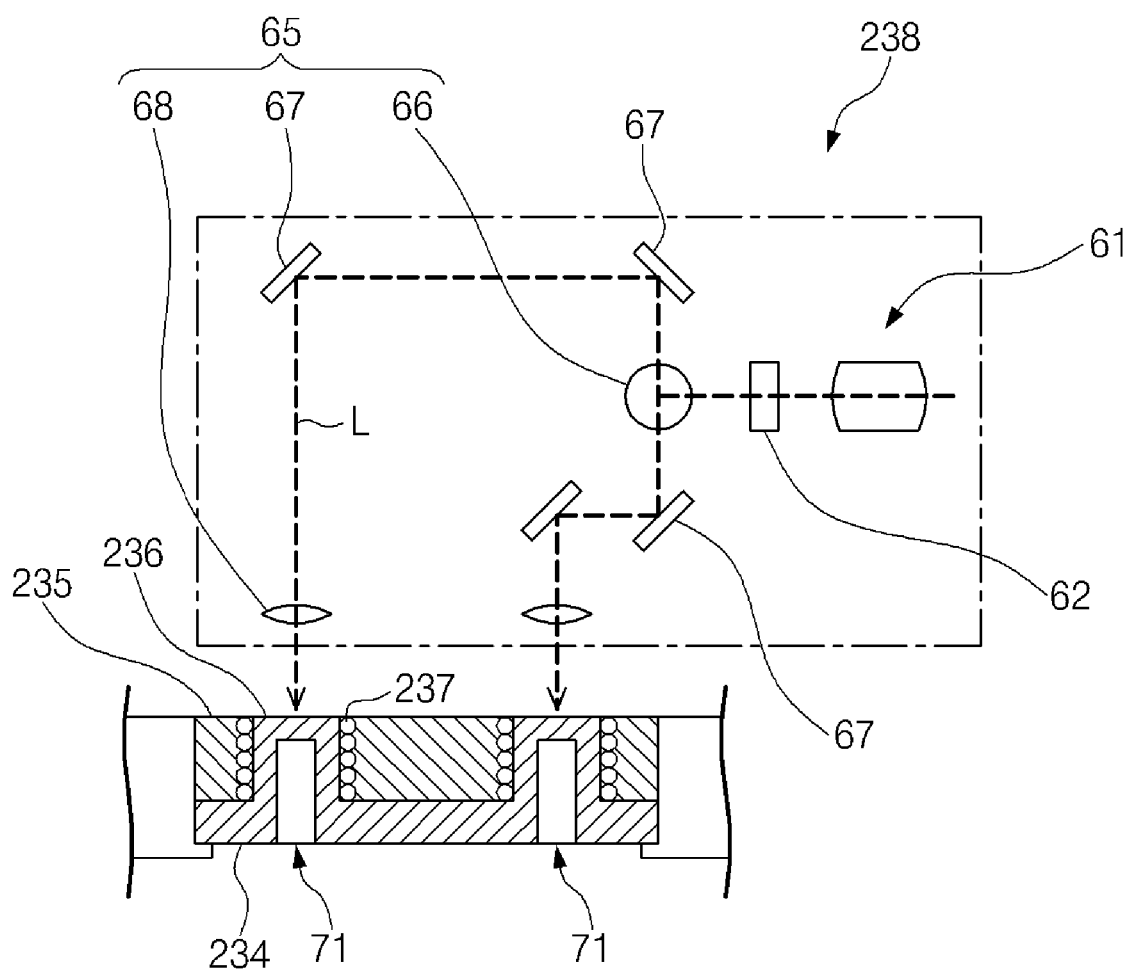
FIG. 41 is a perspective diagram illustrating a schematic construction of a laser generator illustrated in FIG. 39.

A plurality of laser generators 238 are installed at a top of the plurality of quartz plates 234, respectively. As illustrated in FIG. 40, the plurality of quartz plates 234 can be each formed to have a rectangular plate shape of a set thickness. The plurality of quartz plates 234 each has a through-hole 71 (FIG. 41). FIG. 40 illustrates an example in which two through-holes 71 are formed in the quartz plate 234. However, number of the through-holes 71 can increase or decrease according to need.

A transmittance unit 236 covering the through-hole 71 is installed at a top of the through-hole 71. The transmittance unit 236 is protruded from a top surface of the quartz plate 234. Number of the transmittance units 236 can increase or decrease correspondingly to the number of the through-holes 71. The transmittance unit 236 can be formed to have a hollow quartz pipe opened at a lower end and closed at an upper end. The transmittance unit 236 can be welded to a top of the through-hole 71. Thus, a laser beam (L) of the laser generator 238 is irradiated into the silicon substrate 100 passing through the transmittance unit 236 and the through-hole 71 of the quartz plate 234.

Meantime, the heat insulator 235 can be filled in a void space between the plurality of quartz plates 234 and at a top of the plurality of quartz plates 234 excepting a top of the through-hole 71 such that a height of a top surface of the heat insulator 235 is the same as a height of a top surface of the transmittance unit 236.

A cooling unit 237 is installed in each of the transmittance units 236. The cooling unit 237 blocks forwarding of a first thermal energy (E1) by the heater 232 to the laser generator 238 through the transmittance unit 236. The cooling unit 237 can be formed of a cooling pipe of a spiral shape surrounding an external side surface of the transmittance unit 236. Cooling water for cooling the transmittance unit 236 heated by the first thermal energy (E1) and a third thermal energy (E3) circulates within a cooling pipe. The cooling pipe can connect at both ends to a general cooling-water circulator (not shown). The cooling unit 237 is not limited to the aforementioned cooling pipe, but can be modified in various forms as long as being able to circulate the cooling water.

Referring again to FIG. 37, a plurality of laser generators 238 are installed to be spaced a set distance apart from a top of each of the plurality of quartz plates 234. The plurality of laser generators 238 are isolated from the heater 232 by the plurality of quartz plates 234 and the heat insulator 235. Thus, the plurality of quartz plates 234 and the heat insulator 235 block forwarding of a heat generated by the heater 232 to the plurality of laser generators 238.

Alternatively, one quartz plate 234 can be housed in an opening part 53 of the housing 233. In this case, one laser generator 238 is installed at a top of the quartz plate 234, and the heat insulator 235 is filled in a void space around the quartz plate 234 and at a top of the quartz plate 234.

FIG. 41 illustrates a schematic construction of a laser generator illustrated in FIG. 39.

Referring to FIG. 41, the laser generator 238 includes a laser source 61, a beam expander 62, and an optic module 65. The laser source 61 generates a laser beam (L). The beam expander 62 controls an intensity of the laser beam (L) and a degree of emission. The laser beam (L) passing through the beam expander 62 is incident on the optic module 65. The optic module 65 controls an irradiation angle of the laser beam (L) such that the laser beam (L) transmits the transmittance unit 236, and splits the laser beam correspondingly to the number of the transmittance units 236. The laser beam (L) is split into a plurality of laser beams (L) correspondingly to the number of the transmittance units 236, by passing through the optic module 65.

The optic module 65 includes a beam splitter 66, a plurality of folding mirrors 67, and a plurality of focus lenses 68. The plurality of folding mirrors 67 are each rotatably installed. As the plurality of folding mirrors 67 are each rotated, a reflection angle of the laser beam (L) by the plurality of folding mirrors 67 is controlled. The focus lens 68 is positioned at a top of the transmittance unit 236. Number of each of the beam splitter 66, the plurality of folding mirrors 67, and the plurality of focus lenses 68 included in the optic module 65 can increase or decrease depending on the number of the transmittance units 236.

The laser beam (L) passing through the beam expander 62 is split into two laser beams (L) by the beam splitter 66. The two laser beams (L) are each reflected by the plurality of folding mirrors 67 and each pass through the two focus lenses 68. The two laser beams (L) each passing through the two focus lenses 68 each transmit two transmittance units 236 and through-holes 71 and are each irradiated into a surface of the silicon substrate 100. At this time, as the conveyer belt 213 conveys the silicon substrate 100, as illustrated in FIG. 42, the two laser beams (L) are irradiated in a way to scan the surface of the silicon substrate 100.

Meantime, a distance between the two laser beams (L) irradiated into the surface of the silicon substrate 100 can be controlled according to need. In this case, a distance (R0) (FIG. 40) between the two transmittance units 236 of the quartz plate 234 is adjusted suitable to a distance between the two laser beams (L).

Figure 42:
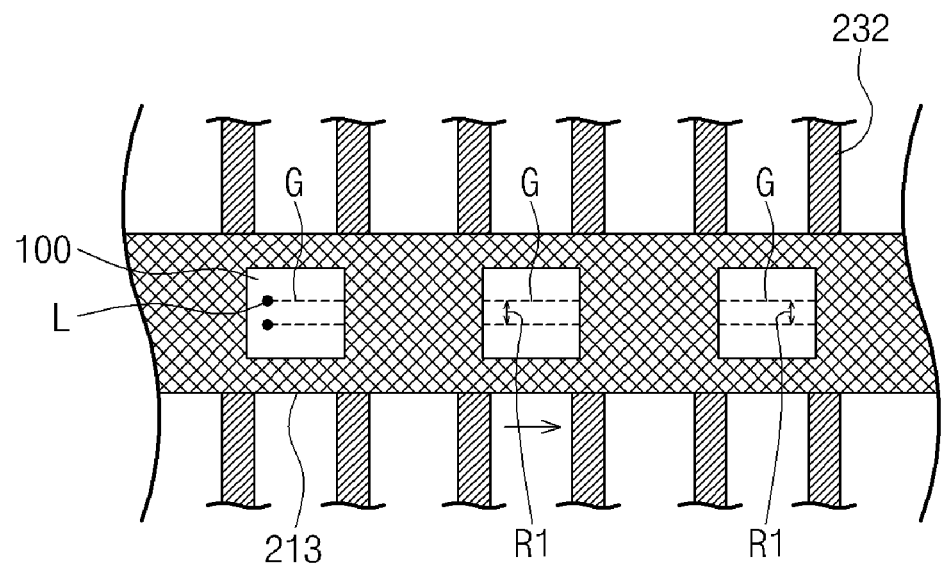
FIG. 42 is a partial plan diagram illustrating an example taken along line "B-B" in the diffusion apparatus of FIG. 39 and then viewed down from a conveyer belt.

For example, if the distances (R0) between the two transmittance units 236 each installed in the plurality of quartz plates 234 are the same as each other, as illustrated in FIG. 42, intervals (R1) between irradiation regions (G) of the two laser beams (L) are the same in the plurality of silicon substrates 100. In this case, two selective emitter regions are formed in each of the plurality of silicon substrates 100.

Figure 43:
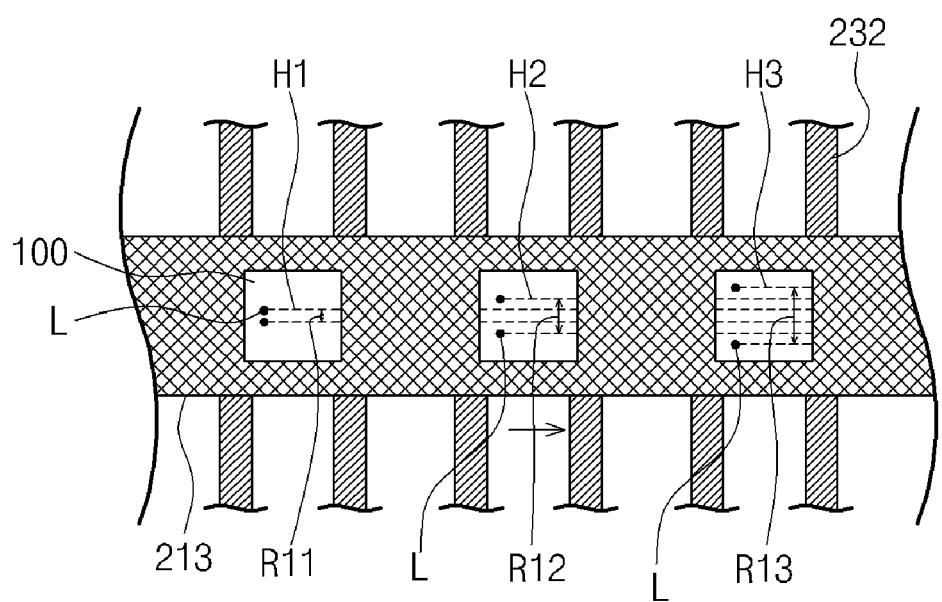
FIG. 43 is a partial plan diagram illustrating another example taken along line "B-B" in the diffusion apparatus of FIG. 39 and then viewed down from a conveyer belt.

Meantime, if the distances (D0) between the two transmittance units 236 each installed in the plurality of quartz plates 234 are different from each other, as illustrated in FIG. 43, intervals (R11 to R13) between the irradiation regions (H1 to H3) of the two laser beams (L) are different from each other in the plurality of silicon substrates 100. In this case, a plurality of selective emitter regions can be formed in each of the plurality of silicon substrates 100.

A method for forming a selective emitter of a solar cell and a diffusion apparatus according to the present invention can realize a high photoelectric conversion efficiency of the solar cell. Also, the method for forming the selective emitter of the solar cell and the diffusion apparatus according to the present invention are applicable to an automation production equipment of an in-line type enabling a mass production of a solar cell and thus, a high productivity can be realized at the time of the mass production of the solar cell.

In the diffusion apparatus according to the present invention, a quartz plate and a heat insulator for blocking a heat generated from a heater are disposed between a laser generator and a heater and thus, a damage of the laser generator due to a heat generated from the heater can be reduced. The laser generator irradiates a laser beam through a transmittance unit installed in the quartz plate and thus, an energy loss of a laser beam can be reduced.

According to the present invention, an emitter layer, which is a lowly doped layer, and a highly doped region are formed together by a single impurity diffusion process and thus, there is no need for an additional diffusion process for forming the highly doped region. Thus, a manufacturing process of a solar cell is not only simplified but also its manufacturing time is shortened, thus being capable of improving productivity. Also, the uniform emitter layer and highly doped region are formed on a surface of a substrate and thus, an error rate of the substrate is not only reduced but also a solar cell of a high quality having a high photoelectric conversion efficiency can be produced.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for forming a selective emitter of a solar cell, the method comprising:
   texturing a surface of a silicon substrate by etching the silicon substrate;
   coating an impurity solution on the surface of the silicon substrate;
   injecting a first thermal energy into the whole surface of the silicon substrate coated with the impurity solution; and
   while the first thermal energy is injected into the whole surface of the silicon substrate, injecting a second thermal energy by irradiating a laser beam into a partial region of the surface of the silicon substrate coated with the impurity solution, wherein impurity ions are diffused into the silicon substrate by the first thermal energy and thus an emitter layer is resultantly formed, and the impurity ions are more diffused into a partial region of the emitter layer by the second thermal energy and thus a selective emitter region is resultantly formed, and wherein the second thermal energy comprises a third thermal energy due to the laser beam and the first thermal energy, and a temperature by the second thermal energy is equal to a temperature by the first thermal energy and the third thermal energy.

2. The method of claim 1, wherein the impurity solution comprises a phosphorus (P) component.

3. The method of claim 1, wherein the impurity solution comprises phosphorus oxychloride ($POCl_3$).

4. The method of claim 1, wherein the silicon substrate is a P-type substrate doped with boron (B) ions,
wherein the emitter layer is an N-type doped layer doped with phosphorus (P) ions, and
wherein the selective emitter region is an N+-type doped region more doped with phosphorus (P) ions than the emitter layer.

5. The method of claim 1, wherein the injecting of the first thermal energy is implemented by a radiative non-contact heater.

6. The method of claim 1, wherein the injecting of the second thermal energy is implemented by a radiative non-contact heater and a laser generator.

7. The method of claim 1, wherein, in the texturing of the surface of the silicon substrate, an unevenness is formed on a surface of the silicon substrate by dry or wet etching.

8. The method of claim 1, wherein part of the selective emitter region corresponds to a region in which a metal electrode is deposited.

9. The method of claim 1, wherein a temperature of the first thermal energy (T1) is in the range of $830° C.\leqq T1 \leqq 900° C.$, and
wherein a temperature of the second thermal energy (T2) is in the range of $830° C.\leqq T2 \leqq 1,070° C.$ 10. The method of claim 1, further comprising, after the injecting of the second thermal energy, removing a Phosphorus Silicate Glass (PSG) layer formed on the surface of the silicon substrate.

11. The method of claim 1, further comprising, after the coating, additionally coating the impurity solution on the partial region of the surface of the silicon substrate, and
wherein, in the injecting of the second thermal energy, the laser beam is irradiated into the partial region additionally coated with the impurity solution.

12. A method for forming a selective emitter of a solar cell, the method comprising:
texturing a surface of a silicon substrate by etching the silicon substrate;
coating an impurity solution on the surface of the silicon substrate;
injecting a first thermal energy into the whole surface of the silicon substrate coated with the impurity solution; and
while the first thermal energy is injected into the whole surface of the silicon substrate, injecting a second thermal energy by irradiating a laser beam into a plurality of set regions of the surface of the silicon substrate coated with the impurity solution,
wherein impurity ions are diffused into the silicon substrate by the first thermal energy and thus an emitter layer is resultantly formed, and the impurity ions are more diffused into the plurality of set regions of the emitter layer by the second thermal energy and thus a plurality of selective emitter regions are resultantly formed, and wherein the second thermal energy comprises a third thermal energy due to the laser beam and the first thermal energy, and a temperature by the second thermal energy is equal to a temperature by the first thermal energy and the third thermal energy.

13. The method of claim 12, further comprising, after the coating, additionally coating the impurity solution on the plurality of set regions of the surface of the silicon substrate, and
wherein, in the injecting of the second thermal energy, the laser beam is irradiated into the plurality of set regions additionally coated with the impurity solution.

14. A diffusion apparatus for forming a selective emitter of a solar cell, the apparatus comprising:
a diffusion chamber having an inlet formed at one side and having an outlet formed at the other side;
a conveyer for conveying a silicon substrate whose surface is textured by an etching process and which is coated with an impurity solution, into the diffusion chamber;
a heater for generating a first thermal energy and injecting the first thermal energy into the whole surface of the silicon substrate conveyed into the diffusion chamber; and
a laser generator for irradiating a laser beam into a partial region or a plurality of set regions of the surface of the silicon substrate,
wherein impurity ions are diffused into the silicon substrate by the first thermal energy and thus an emitter layer is resultantly formed, and the impurity ions are more diffused into a partial region or a plurality of set regions of the emitter layer by the second thermal energy and thus a selective emitter region is resultantly formed or a plurality of selective emitter regions are resultantly formed, and wherein the second thermal energy comprises a third thermal energy due to the laser beam and the first thermal energy, and a temperature by the second thermal energy is equal to a temperature by the first thermal energy and the third thermal energy.

15. The apparatus of claim 14, wherein the conveyer comprises:
a conveyer belt on which the silicon substrate is mounted; and
a plurality of rotating rollers for circulating the conveyer belt such that the silicon substrate mounted on the conveyer belt is conveyed at a set speed from the inlet of the diffusion chamber to the outlet,
wherein the conveyer belt comprises a metal net.

16. The apparatus of claim 14, wherein the heater comprises a radiative non-contact heater.

17. The apparatus of claim 15, wherein the heater is installed to surround the conveyer belt at a set distance from the conveyer belt, within the diffusion chamber.

18. The apparatus of claim 15, wherein the silicon substrate additionally coated with the impurity solution in the partial region or the plurality of set regions of the surface of the silicon substrate is mounted on the conveyer belt.

19. The apparatus of claim 15, wherein the heater comprises a plurality of non-contact heat lines spaced a set distance apart from the conveyer belt and installed at a top and bottom of the conveyer belt, within the diffusion chamber, and wherein the plurality of non-contact heat lines are spaced a set distance apart from each other along the conveyer belt and are installed to be at right angles with the conveyer belt, respectively.

20. The apparatus of claim 15, wherein the diffusion chamber comprises:
- at least one quartz plate comprising at least one through-hole;
- a heat insulator filled at a top of the at least one quartz plate excepting a top of the at least one through-hole, and around the at least one quartz plate; and
- a housing comprising a first set space connecting with the inlet and the outlet and a second set space positioned at a top of the first set space,
- wherein the conveyer belt circulates passing through the inlet, the first set space, and the outlet, and
- wherein the at least one quartz plate and the heat insulator are supported by a support protruding from an internal surface of the housing, and is housed within the second set space.

21. The apparatus of claim 17, wherein the laser generator is installed outside the diffusion chamber, and irradiates the laser beam into a partial region or a plurality of set regions of the surface of the silicon substrate, through a plurality of tubes, and
- wherein the plurality of tubes are installed to each pass through a portion of a top surface of the diffusion chamber and a portion of a top surface of the heater and face the conveyer belt.

22. The apparatus of claim 17, further comprising an exhaust pump for discharging out an overheated air or remaining impurities within the diffusion chamber, through an exhaust pipe,
- wherein the exhaust pipe is installed to each pass through a portion of a top surface of the diffusion chamber and a portion of a top surface of the heater and extend outside the diffusion chamber.

23. The apparatus of claim 20, wherein the at least one quartz plate further comprises at least one transmittance unit covering the at least one through-hole and protruding from a top surface of the at least one quartz plate,
- wherein the at least one transmittance unit comprises a hollow quartz pipe opened at a lower end and closed at an upper end,
- wherein a top of the first set space is sealed by housing the at least one quartz plate and the heat insulator within the second set space, and
- wherein the laser generator is installed outside the diffusion chamber, and irradiates the laser beam into the partial region or the plurality of set regions of the surface of the silicon substrate, through the at least one transmittance unit and the at least one through-hole.

24. The apparatus of claim 23, further comprising a cooling unit installed at an external side surface of the at least one transmittance unit and cooling the at least one transmittance unit heated by the first and third thermal energies.

25. The apparatus of claim 23, wherein the laser generator comprises:
- a laser source for generating the laser beam;
- a beam expander for controlling an intensity of the laser beam and a degree of emission; and
- an optic module for controlling an irradiation angle of the laser beam such that the laser beam passing through the beam expander transmits the at least one transmittance unit, and splitting the laser beam correspondingly to number of the transmittance units.

* * * * *